US012765026B2

(12) United States Patent
Wu et al.

(10) Patent No.: US 12,765,026 B2
(45) Date of Patent: Oct. 13, 2026

(54) DOUBLE-SIDED JANUS TRANSITION METAL DICHALCOGENIDE CMOS DEVICE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Yuh-Renn Wu, Taipei City (TW); Yun-Ping Chiu, Taipei City (TW); Hsin-Wen Huang, Kaohsiung City (TW); Hsiu-Chi Pai, Hsinchu City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 458 days.

(21) Appl. No.: 18/448,364

(22) Filed: Aug. 11, 2023

(65) Prior Publication Data

US 2025/0056857 A1 Feb. 13, 2025

(51) Int. Cl.

| | |
|---|---|
| ***H10D 62/84*** | (2025.01) |
| ***H10D 30/60*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ........... *H10D 62/84* (2025.01); *H10D 30/611* (2025.01); *H10D 84/0177* (2025.01); *H10D 84/038* (2025.01); *H10D 84/85* (2025.01)

(58) Field of Classification Search

CPC .. H10D 30/611; H10D 30/481; H10D 30/017; H10D 62/84; H10D 62/883; H10D 84/02

See application file for complete search history.

(56) References Cited

U.S. PATENT DOCUMENTS

2010/0327355 A1* 12/2010 Yuan .................. H10D 86/0214 257/E27.113
2021/0288152 A1* 9/2021 Reddy Arava ......... H10D 64/01

OTHER PUBLICATIONS

Yu Ding et al., First-Principles Predictions of Janus MoSSe and WSSe for FET Applications, 2020, J. Phys. Chem. C. (Year: 2020).*
Yiwei Zhao et al., Performance Upper Limit of Sub-10 nm Monolayer MoS2 Transistors with MoS2-Mo Electrodes, 2022, J. Phys. Chem. C. (Year: 2022).*
Monika Kumari et al., A detailed investigation of dielectric-modulated dual-gate Tmd Fet based label-free biosensor via analytical modelling, 2022, Nature Scientific Reports 12. (Year: 2022).*

(Continued)

*Primary Examiner* — Davienne N Monbleau
*Assistant Examiner* — Emily Farmer
(74) *Attorney, Agent, or Firm* — Birch, Stewart, Kolasch & Birch, LLP

(57) ABSTRACT

An integrated circuit device includes a Janus transition metal dichalcogenide layer, a first gate structure, and a second gate structure. The Janus transition metal dichalcogenide layer has opposite first and second sides. The first gate structure is on the first side of the Janus transition metal dichalcogenide layer. A second gate structure is on the second side of the Janus transition metal dichalcogenide layer.

20 Claims, 40 Drawing Sheets

(56) References Cited

OTHER PUBLICATIONS

Chit Siong Lau et al., Dielectrics for Two-Dimensional Transition-Metal Dichalcogenide Applications, 2023, ACS Nano vol. 17 Issue 11. (Year: 2023).*

Kumari, M., Singh, N.K. & Sahoo, M. A detailed investigation of dielectric-modulated dual-gate TMD FET based label-free biosensor via analytical modelling. Sci Rep 12, 21115 (2022). (Year: 2022).*

Cho et al., "A high-performance complementary inverter based on transition metal dichalcogenide field-effect transistors", Nanoscale Res. Lett. 10:115, 2015, pp. 1-6.

Pezeshki et al., "Static and Dynamic Performance of Complementary Inverters Based on Nanosheet α-$MoTe_2$p-Channel and MoS2 n-Channel Transistors", ACS Nano, vol. 10, No. 1, 2016, pp. 1118-1125.

Zhao et al., "Dipole-induced Ohmic contacts between monolayer Janus MoSSe and bulk metals", npj 2D Materials and Applications, vol. 5, Article No. 72, 2021, pp. 1-5.

* cited by examiner

DOUBLE-SIDED JANUS TRANSITION METAL DICHALCOGENIDE CMOS DEVICE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
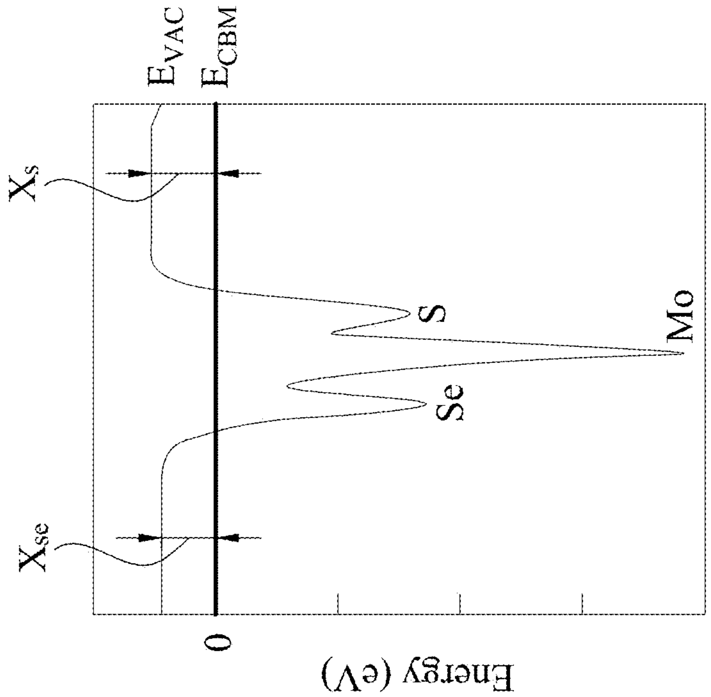
FIG. 2 is a diagram illustrating an electrostatic potential for a MoSSe monolayer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Janus transition metal dichalcogenide (TMD) is a class of materials with the chemical formula MXY. M is a transition metal element such as titanium, vanadium, cobalt, nickel, zirconium, molybdenum, technetium, rhodium, palladium, hafnium, tantalum, tungsten, rhenium, iridium, platinum. X and Y are chalcogens such as sulfur, selenium, or tellurium, in which X is different from Y. Examples of Janus TMD include MoSSe, WSSe, MoSTe, PtSeTe, the like, or a combination thereof. Once formed, the Janus TMD layer is in a layered structure with one or a plurality of two-dimensional layers of the general form X-M-Y, with the chalcogen atoms in two planes separated by a plane of metal atoms.

Figure 1:
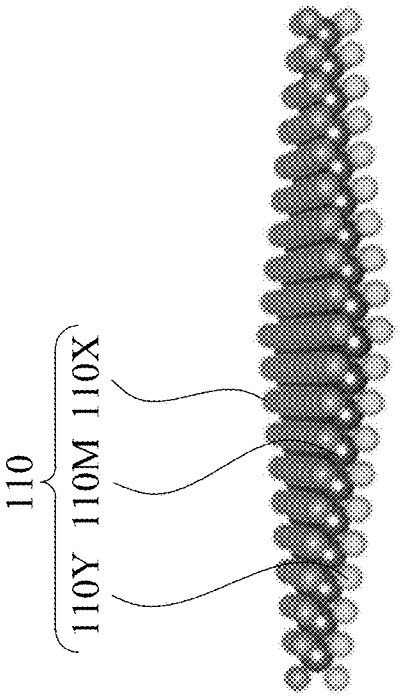
FIG. 1 illustrate a perspective view of a Janus transition metal dichalcogenide (TMD) monolayer in accordance with some embodiments.

FIG. 1 illustrates a perspective view of a Janus TMD layer 110 in accordance with some embodiments. The Janus TMD layer 110 may be a mono-layer or may include a few mono-layers. FIG. 1 illustrates a schematic view of a mono-layer 110 in accordance with some example embodiments. The one-molecule thick Janus TMD layer 110 comprises transition metal atoms 110M and chalcogen atoms 110X and 110Y. The transition metal atoms 110M may form a layer in a middle region of the one-molecule thick TMD layer 110, the chalcogen atoms 110X may form a first layer over the layer of transition metal atoms 110M, and the chalcogen atoms 110Y may form a second layer underlying the layer of transition metal atoms 110M. The transition metal atoms 110M may be W atoms, Mo atoms, Pt atoms. The chalcogen atoms 110X and 110Y may be S atoms, Se atoms, or Te atoms, in which the chalcogen atoms 110X are different from the chalcogen atoms 110Y. In some examples, each of the transition metal atoms 110M is bonded (e.g., by covalent bonds) to six chalcogen atoms 110X and 110Y, and each of the chalcogen atoms 110X and 110Y is bonded (e.g. by covalent bonds) to three transition metal atoms 110M. Throughout the description, the illustrated cross-bonded layers including one layer of transition metal atoms 110M, a layer of chalcogen atoms 110X, and a layer of chalcogen atoms 110Y in combination are referred to as a mono-layer 110 of the Janus TMD layer.

FIG. 2 is a diagram illustrating an electrostatic potential for a MoSSe monolayer in accordance with some embodiments. As shown in FIG. 2, at S side, an electron affinity $X_s$ is between the conduction band minimum $E_{CBM}$ and the vacuum level $E_{VAC}$. At Se side, an electron affinity $X_{se}$ is between the conduction band minimum $E_{CBM}$ and the vacuum level $E_{VAC}$. The electron affinity $X_s$ at S side is greater than the electron affinity $X_{se}$ at Se side. Due to the structural asymmetry and affinity difference, the Janus TMD materials, such as MoSSe and WSSe, intrinsically exhibit interface dipole. The dipole fields can be obtained by electrostatic potential, dielectric constant, and thickness, which are all extracted from first-principle (here, density functional theory, DFT) calculation. For example, for MoSSe and WSSe, S-side Affinity is greater than Se-side Affinity. For MoSSe, the S-side Affinity may be in a range from about 4 eV to about 4.2 eV, the Se-side Affinity may be in a range from about 3.4 eV to about 3.6 eV, and the dipole field may be in a range from about $2\times10^6$ to about $2.2\times10^6$. For WSSe, S-side Affinity may be in a range from about 4.3 eV to about 4.5 eV, and is greater than Se-side Affinity may be in a range from about 3.6 eV to about 3.8 eV, and the dipole field may be in a range from about $1.4\times10^6$ to about $1.6\times10^6$.

Figure 3A:
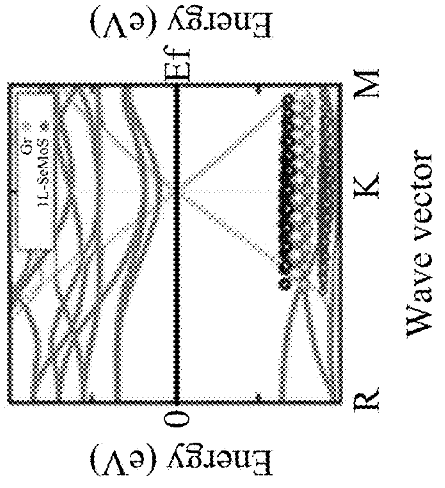
FIG. 3A shows band structures for a MoSSe monolayer with a graphene contacting the S side of the MoSSe monolayer.

FIG. 3A shows band structures for a MoSSe monolayer with a graphene contacting the S side of the MoSSe monolayer. In FIG. 3A and following FIGS. 3B-3D, the band structures are examined by DFT. By attaching the S side to the graphene, the conduction bands of the MoSSe monolayer are close to the fermi level ($E_F$) than the valence bands of the MoSSe monolayer, and thus the dipole-induced n-type contact is formed. And, while the conduction bands of the MoSSe monolayer are spaced apart from the fermi level ($E_F$), a Schottky Barrier is examined between the MoSSe monolayer and the n-type contact.

Figure 3B:
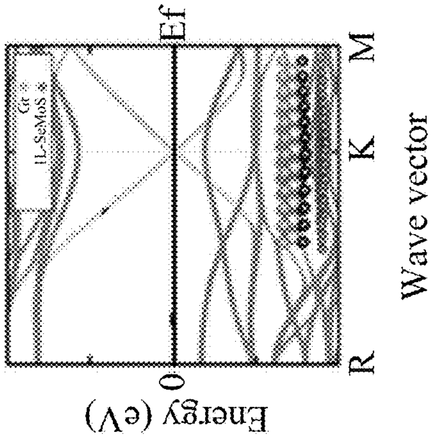
FIG. 3B shows band structures for a MoSSe monolayer with a graphene contacting the Se side of the MoSSe monolayer.

FIG. 3B shows band structures for a MoSSe monolayer with a graphene contacting the Se side of the MoSSe monolayer. By attaching the Se side to the graphen, the valence bands of the MoSSe monolayer are close to the fermi level ($E_F$) than the conduction bands of the MoSSe monolayer, and thus the dipole-induced p-type contact is formed. And, while the valence bands of the MoSSe monolayer are spaced apart from the fermi level ($E_F$), a Schottky Barrier is examined between the MoSSe monolayer and the p-type contact.

Figure 3C:
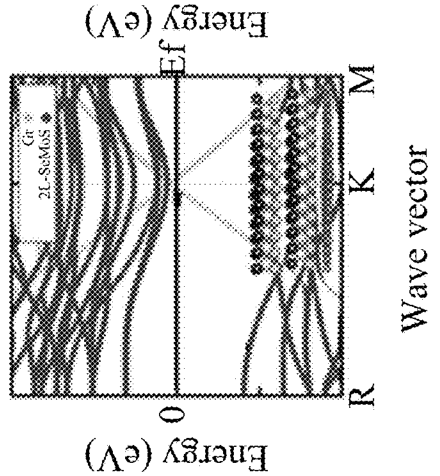
FIG. 3C shows band structures for a MoSSe bilayer with a graphene contacting the S side of the MoSSe bilayer.

FIG. 3C shows band structures for a MoSSe bilayer with a graphene contacting the S side of the MoSSe bilayer. By attaching the S side to the graphene, the conduction bands of the MoSSe bilayer are close to the fermi level ($E_F$) than the valence bands of the MoSSe bilayer, and thus the dipole-induced n-type contact is formed. And, the n-type contact is almost an ohmic contact since there is merely a very small Schottky Barrier between bands of the MoSSe bilayer and the fermi level ($E_F$).

Figure 3D:
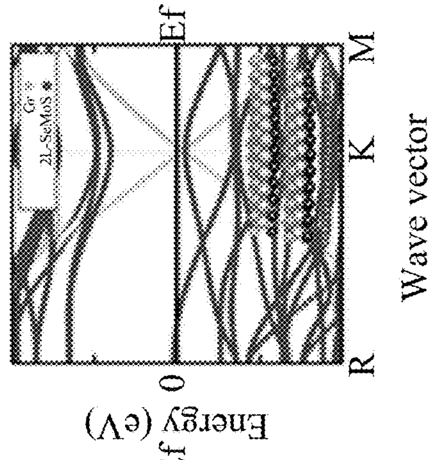
FIG. 3D shows band structures for a MoSSe bilayer with a graphene contacting the Se side of the MoSSe bilayer.

FIG. 3D shows band structures for a MoSSe bilayer with a graphene contacting the Se side of the MoSSe bilayer. By attaching the Se side to the graphene, the valence bands of the MoSSe bilayer are close to the fermi level ($E_F$) than the conduction bands of the MoSSe bilayer, and thus the dipole-induced p-type ohmic contact is formed. In FIGS. 3C and 3D, the bilayer configuration in the JTMD may bend bands and lower band gaps between the conduction band and the valence band, thereby facilitating ohmic contact formation at the contact region.

Figure 4:
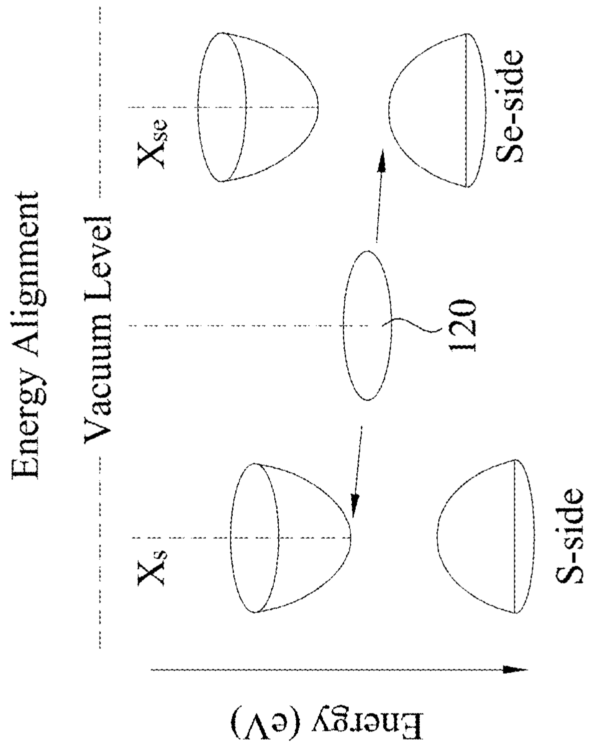
FIG. 4 illustrates an energy alignment among the S side and Se side of the MoSSe monolayer and the graphene.

FIG. 4 illustrates an energy alignment among the S side and Se side of the MoSSe monolayer and a conductive feature 120. The conductive feature 120 can be selected to have suitable work function aligned to be between a conduction band minimum at S side of the MoSSe and a valence band maximum at Se side of the MoSSe. Furthermore, the work function of the conductive feature 120 is closer to the conduction band minimum at S side of the MoSSe than to a valence band maximum at S side of the MoSSe, and is closer to the valence band maximum at Se side of the MoSSe than to a conduction band minimum at Se side of the MoSSe. For example, the work formation of the conductive feature 120 is in a range from about 4.3 eV to about 5.1 eV, which is between a conduction band minimum at S side of the MoSSe and a valence band maximum at Se side of the MoSSe, closer to the conduction band minimum at S side of the MoSSe than to the valence band maximum at S side of the MoSSe, and closer to the valence band maximum at Se side of the MoSSe than to the conduction band minimum at Se side of the MoSSe. In some embodiments, the conductive feature 120 is graphene, which have a suitable work function (e.g., about 4.4 eV to about 4.6 eV) to achieve the configuration. In some embodiments, the conductive features 120 may be metals, such as Al, Ti, Ni, Au. Through the design, the conductive feature 120 can serve as a n-type contact with the S side of the MoSSe, and serve as a p-type contact with the Se side of the MoSSe.

Figure 5C:
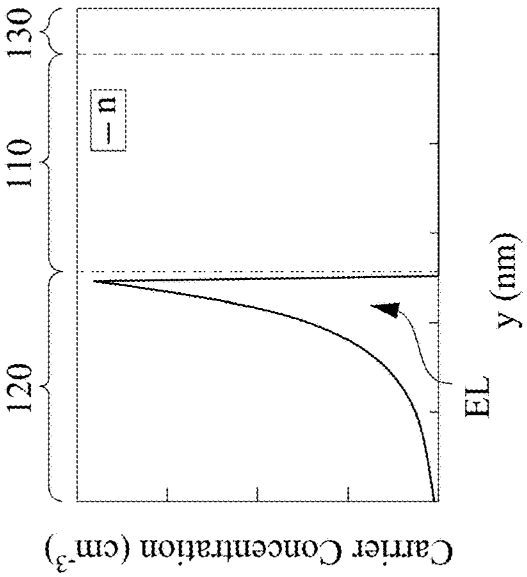
FIG. 5C shows a carrier concentration of the structure of FIG. 5A.
Figure 5B:
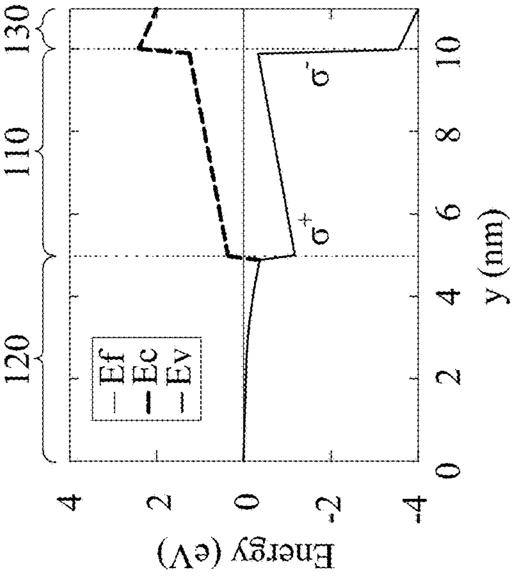
FIG. 5B is a band diagram of the structure of FIG. 5A.
Figure 5A:
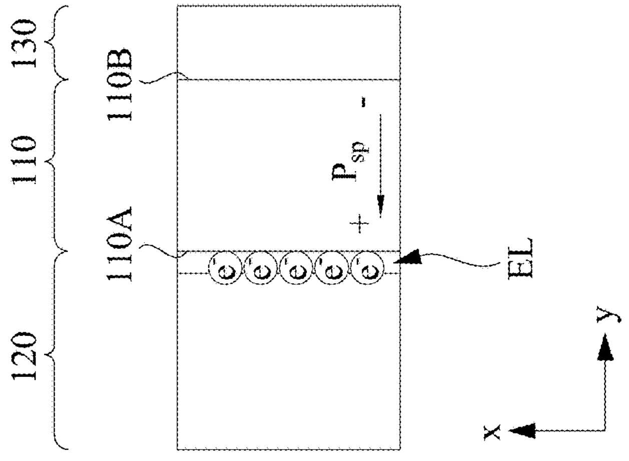
FIG. 5A is a cross-sectional view of a structure including a Janus TMD layer with a first side adjoining a conductive feature and a second side adjoining a dielectric layer.

FIG. 5A is a cross-sectional view of a Janus TMD layer 110 has a first side 110A adjoining a conductive feature 120 and a second side 110B adjoining a dielectric layer 130. FIG. 5B is a band diagram of the structure of FIG. 5A. FIG. 5C shows a carrier concentration of the structure of FIG. 5A. The Janus TMD layer 110 has an intrinsic dipole along a direction from a second side 110B to the first side 110A, as the direction of spontaneous polarization $P_{sp}$. The first side 110A has a greater electrostatic potential energy than that of the second side 110B. For MoSSe, the first side 110A is S side, and the second side 110B is Se side. This intrinsic dipole in the Janus TMD layer 110 can produce accumulation of electrons at interface between the first side 110A of the MoSSe and other materials (e.g., the conductive feature 120). For example, a layer EL of accumulation of electrons is indicated in the drawings. In the present embodiments, the layer EL of accumulation of electrons can be in direct contact with the conductive feature 120, which allows the conductive feature 120 serve as a n-type contact over the Janus TMD layer.

Figure 5D:
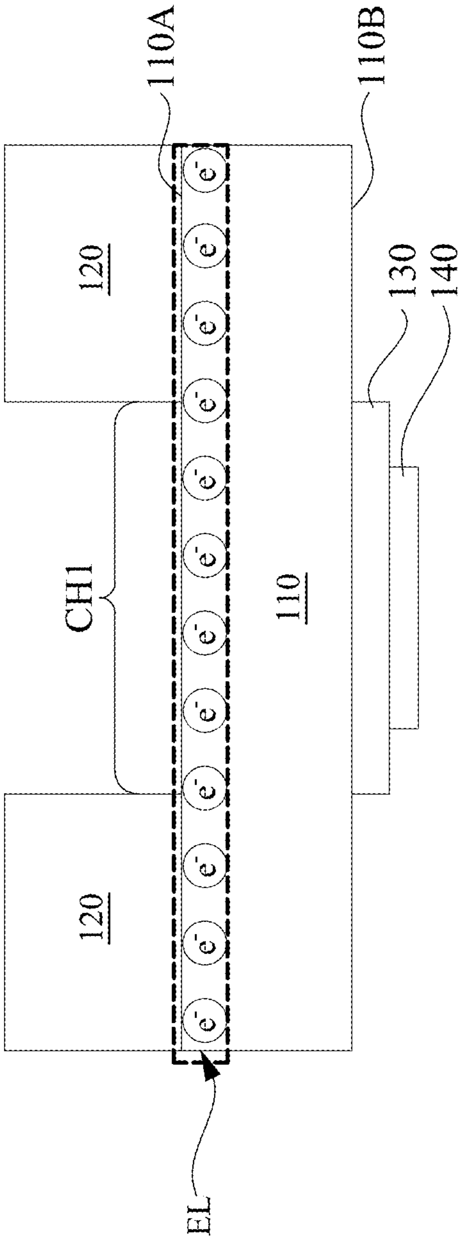
FIG. 5D is a cross-sectional view of an n-type transistor including a Janus TMD layer according to some embodiments of the present disclosure.

FIG. 5D is a cross-sectional view of an n-type transistor including a Janus TMD layer according to some embodiments of the present disclosure. The n-type transistor NT includes a Janus TMD layer 110, conductive features 120, a dielectric layer 130, and a gate electrode 140. As illustrated in FIG. 5A, the Janus TMD layer 110 has a first side 110A adjoining a conductive feature 120 and a second side 110B adjoining a dielectric layer 130. The dielectric layer 130 spaces the Janus TMD layer 110 from the gate electrode 140. This intrinsic dipole in the Janus TMD layer 110 can produce accumulation of electrons at interface between the MoSSe and other materials (e.g., the conductive features 120 and air), which is illustrated as the layer EL of accumulation of electrons. In channel region (regions free of contacting the conductive feature 120), a portion of the layer EL of accumulation of electrons at interface between the MoSSe and air may serve as a channel CH1, like a two-dimensional electron gas (2DEG). The channel CH1 may be normally on. And, the channel CH1 can be controlled by the gate electrode 140. And, other portions of the layer EL of accumulation of electrons at interfaces between the MoSSe and the conductive feature 120 may be in direct contact with the conductive feature 120, thereby forming a n-type contact for the n-type transistor NT. In the present embodiments, the gate electrode 140 may overlie the channel CH1 and has a length less than a length of the channel CH1 between the conductive features 120. Ins some alternative embodiments, the gate electrode 140 may have a length substantially equal to or greater than a length of the channel CH1 between the conductive features 120.

Figure 6C:
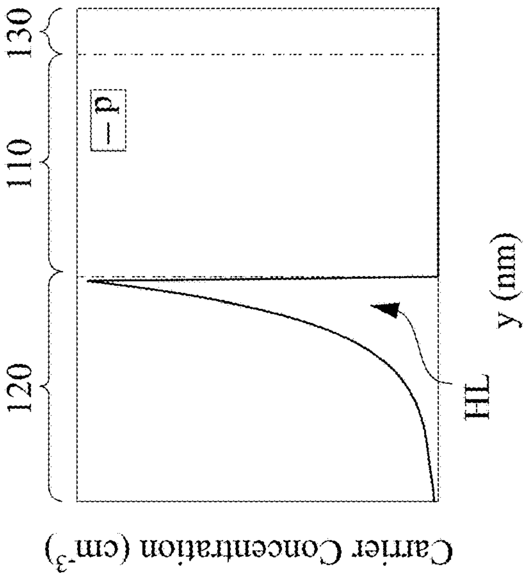
FIG. 6C shows a carrier concentration of the structure of FIG. 6A.
Figure 6B:
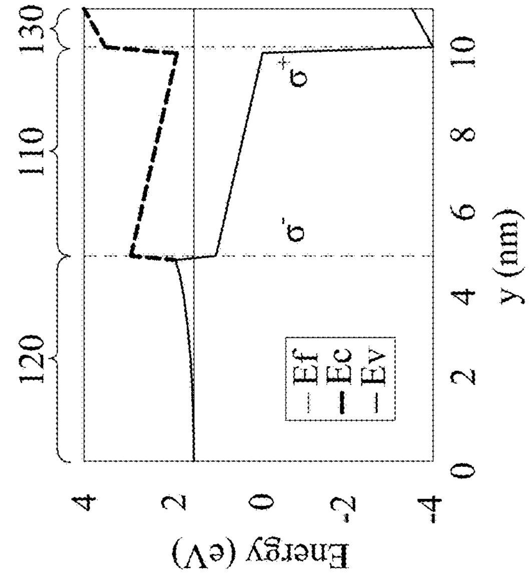
FIG. 6B is a band diagram of the structure of FIG. 6A.
Figure 6A:
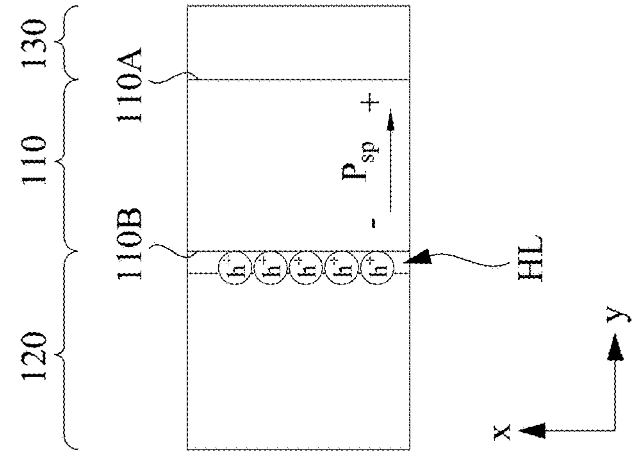
FIG. 6A is a cross-sectional view of a structure including a Janus TMD layer with a first adjoining a dielectric layer and a second side adjoining a conductive feature.

FIG. 6A is a cross-sectional view of a structure including a Janus TMD layer with a first side 110A adjoining a dielectric layer 130 and a second side 110B adjoining a conductive feature. FIG. 6B is a band diagram of the structure of FIG. 6A. FIG. 6C shows a carrier concentration of the structure of FIG. 6A. The Janus TMD layer 110 has an intrinsic dipole along a direction from the second side 110B to the first side 110A, as the direction of spontaneous polarization $P_{sp}$. The intrinsic dipole in the Janus TMD layer 110 can result in electron expulsion and accumulation of holes at interface between the second side 110B of MoSSe and other materials (e.g., the conductive feature 120). For example, a layer HL of accumulation of electrons is indicated in the drawings. In the present embodiments, the layer HL of accumulation of holes can be in direct contact with the conductive feature 120, which allows the conductive feature 120 serve as a p-type contact over the Janus TMD layer.

Figure 6D:
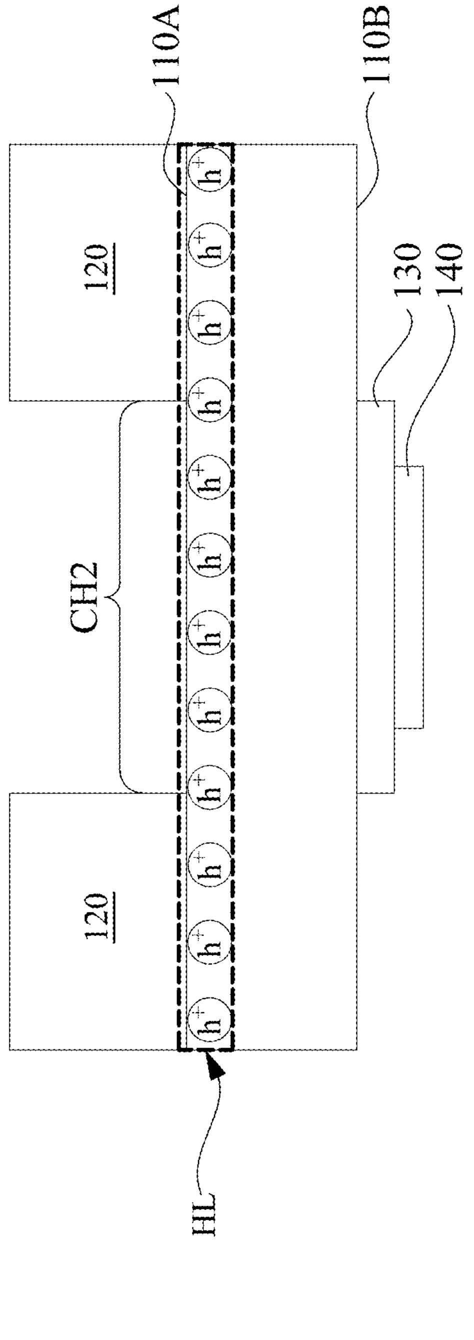
FIG. 6D is a cross-sectional view of a p-type transistor including a Janus TMD layer according to some embodiments of the present disclosure.

FIG. 6D is a cross-sectional view of a p-type transistor including a Janus TMD layer according to some embodiments of the present disclosure. The p-type transistor PT includes a Janus TMD layer 110, conductive features 120, a dielectric layer 130, and a gate electrode 140. As illustrated in FIG. 6A, the Janus TMD layer 110 having a first side 110A adjoining a conductive feature 120 and a second side 110B adjoining a dielectric layer 130. The dielectric layer 130 spaces the Janus TMD layer 110 from the gate electrode 140. This intrinsic dipole in the Janus TMD layer 110 can produce accumulation of holes at interface between the MoSSe and other materials (e.g., the conductive features 120 and air), which is illustrated as the layer HL of accumulation of holes. In channel region (regions free of contacting the conductive feature 120), a portion of the layer HL of accumulation of holes at interface between the MoSSe and air may serve as a channel CH2, like a two-dimensional hole gas (2DHG). The channel CH2 may be normally on. And, the channel CH2 can be controlled by the gate electrode 140. And, other portions of the layer HL of accumulation of holes at interfaces between the MoSSe and the conductive feature 120 may be in direct contact with the conductive feature 120, thereby forming a p-type contact for the p-type transistor PT. In the present embodiments, the gate electrode 140 may overlie the channel CH2 and has a length less than a length of the channel CH2 between the conductive features 120. Ins some alternative embodiments, the gate electrode 140 may have a length substantially equal to or greater than a length of the channel CH2 between the conductive features 120.

Figure 7B:
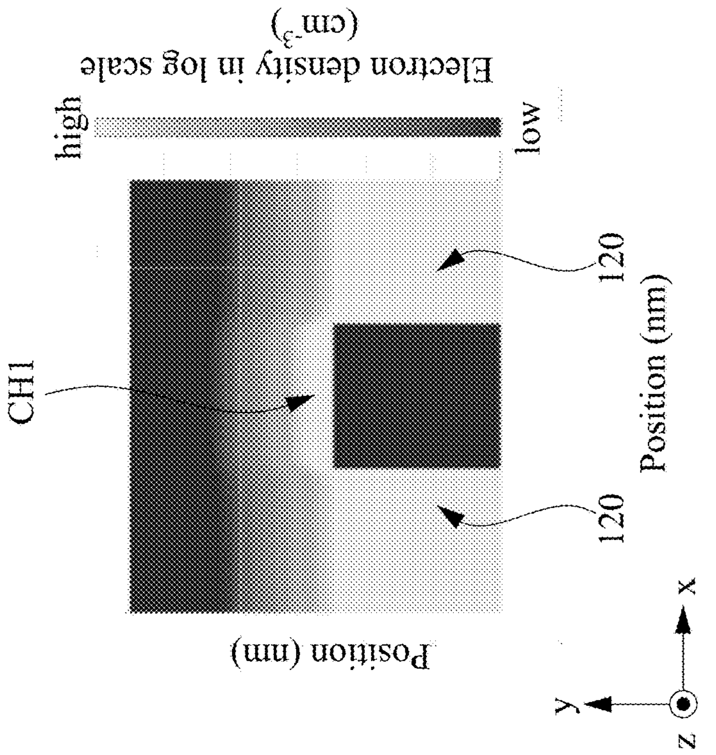
FIG. 7B shows an electron density of the n-type transistor of the FIG. 7A.
Figure 7A:
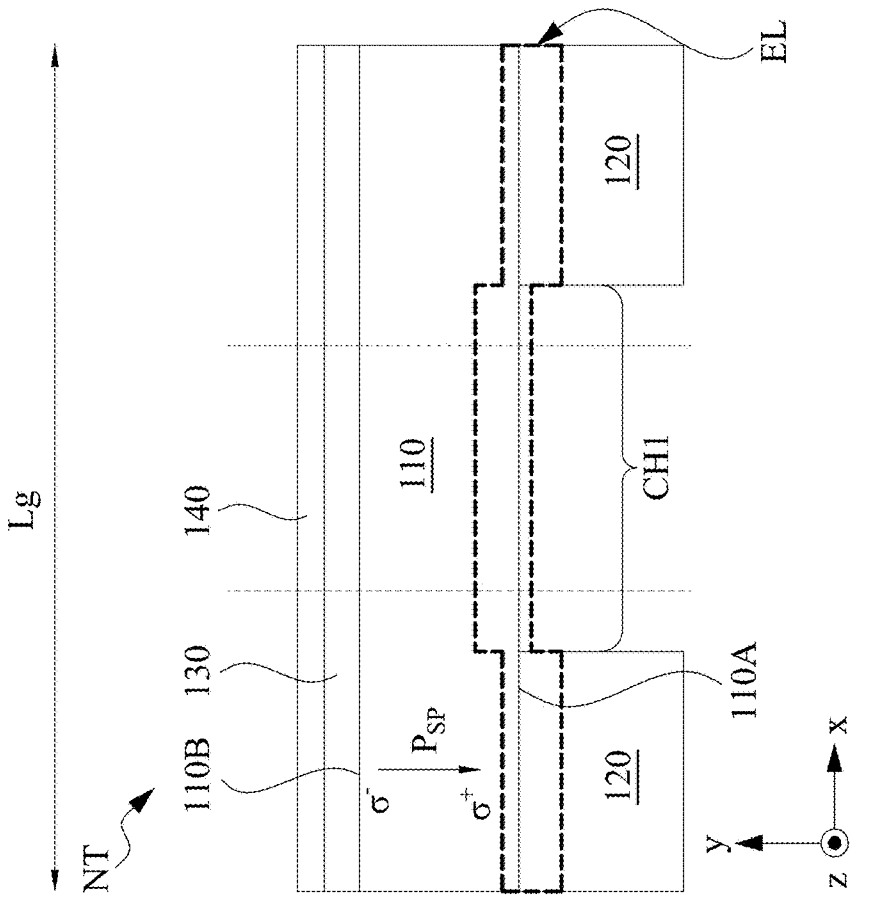
FIG. 7A is a cross-sectional view of an n-type transistor including a Janus TMD layer according to some embodiments of the present disclosure.

FIG. 7A is a cross-sectional view of an n-type transistor NT including a Janus TMD layer 110 according to some embodiments of the present disclosure. Details of the present embodiments are similar to that of FIG. 5D, except that the gate electrode 140 has a length different from that of FIG. 7A. For example, the gate electrode 140 has a length Lg greater than a length of the channel CH1. For example, the dielectric layer 130 covers an entirety of the second side 110B of the Janus TMD layer 110, and the gate electrode 140 covers an entirety of the dielectric layer 130.

Reference is made to FIGS. 7A and 7B. FIG. 7B shows an electron density of the n-type transistor NT of the FIG. 7A. The layer EL of accumulation of electrons is evidenced at interface between the MoSSe and air and at interfaces between the MoSSe and the conductive feature 120. The portion of the layer EL of accumulation of electrons at interface between the MoSSe and air may serve as a channel CH1, like a 2DEG.

Figure 7C:
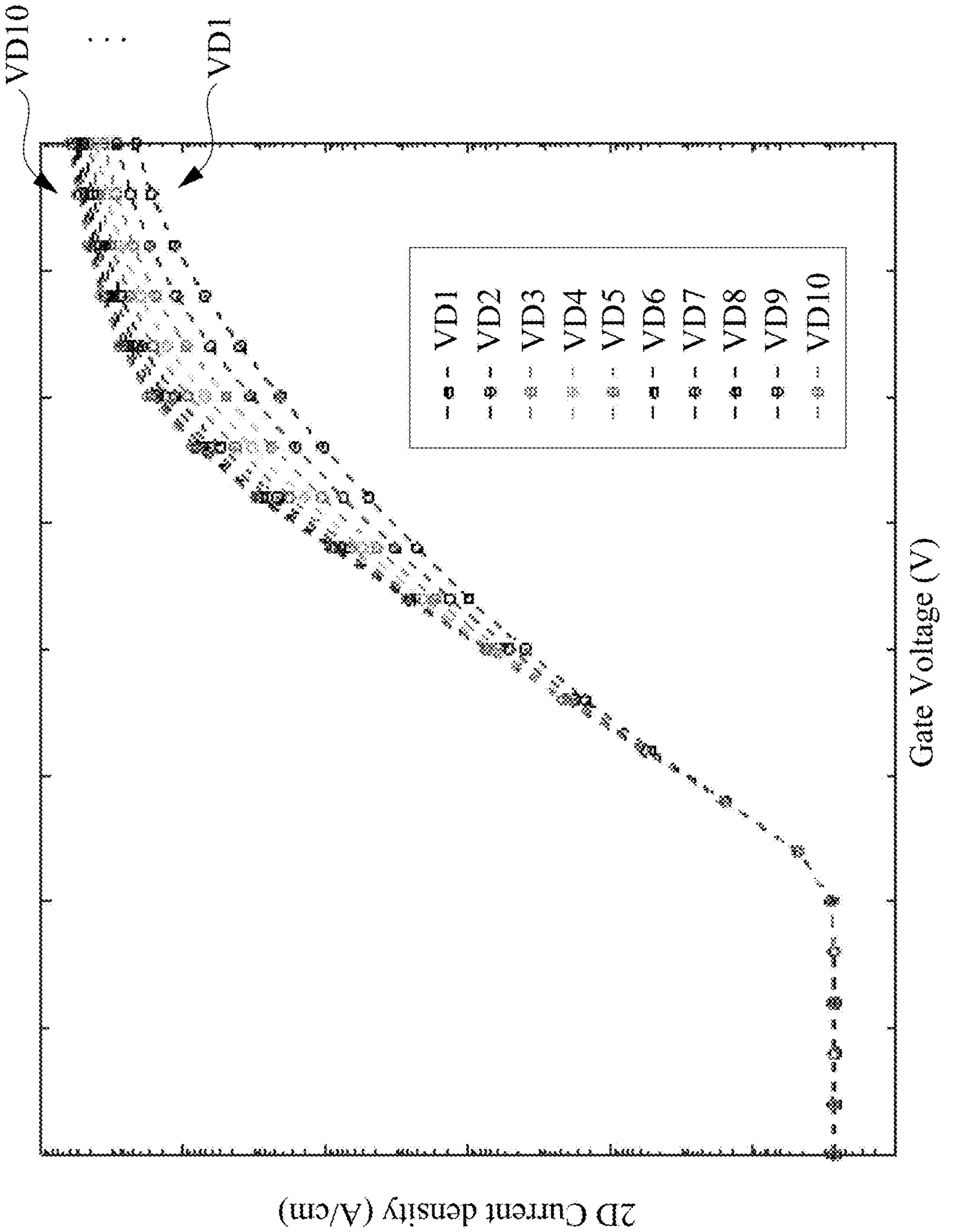
FIG. 7C shows curves of drain current versus gate bias voltage of the n-type transistor of the FIG. 7A.

FIG. 7C shows curves of drain current versus gate bias voltage of the n-type transistor of the FIG. 7A. The horizontal axis represents gate voltage, the vertical axis represents two-dimensional current density. Various curves with different drain voltages are shown as curves VD1-VD10, in which the drain voltages are positive and increasing in a sequence from the curve VD1 to the curve VD10. In FIG. 7C, it is evidenced that the gate electrode 140 has the ability to control the channel CH1, a portion of the layer EL of accumulation of electrons, and the transistor is normally on.

Figure 8B:
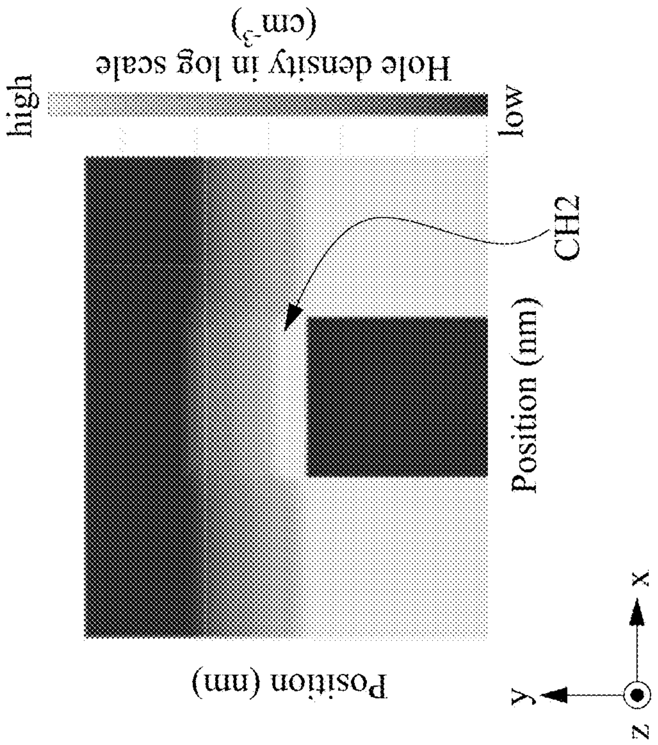
FIG. 8B shows an electron density of the p-type transistor of the FIG. 8A.
Figure 8A:
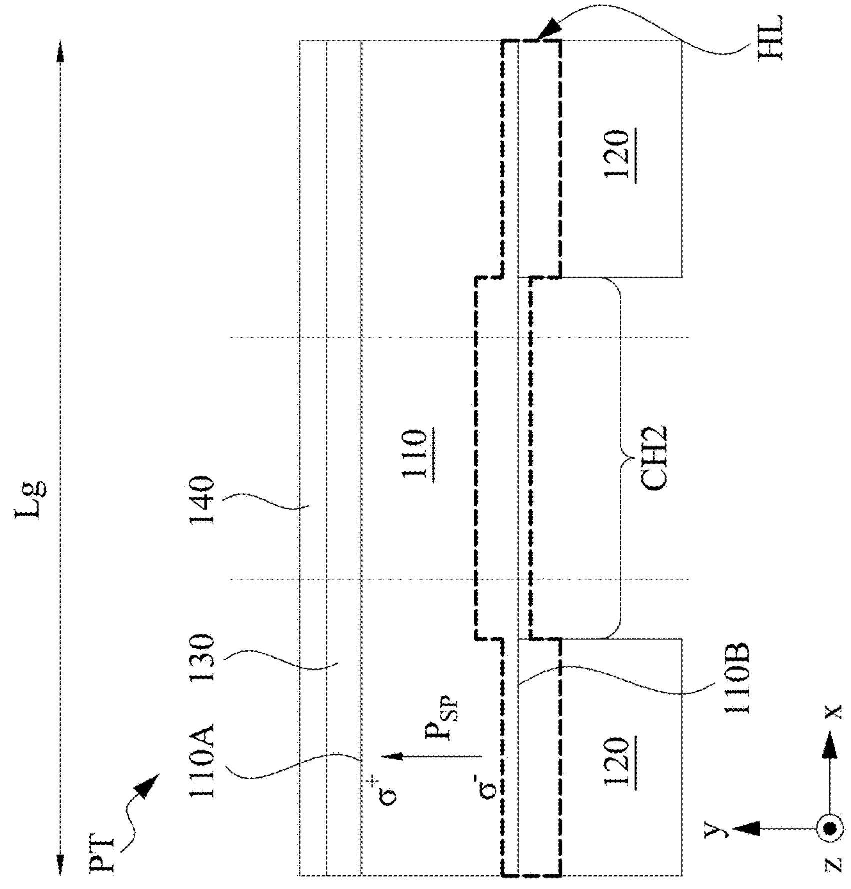
FIG. 8A is a cross-sectional view of a p-type transistor including a Janus TMD layer according to some embodiments of the present disclosure.

FIG. 8A is a cross-sectional view of a p-type transistor including a Janus TMD layer according to some embodiments of the present disclosure. Details of the present embodiments are similar to that of FIG. 6D, except that the gate electrode 140 has a length different from that of FIG. 8A. For example, the gate electrode 140 has a length Lg greater than a length of the channel CH2. For example, the dielectric layer 130 covers an entirety of the first side 110A of the Janus TMD layer 110, and the gate electrode 140 covers an entirety of the dielectric layer 130.

Reference is made to FIGS. 8A and 8B. FIG. 8B shows an electron density of the p-type transistor of the FIG. 8A. The layer HL of accumulation of holes is evidenced at interface between the MoSSe and air and at interfaces between the MoSSe and the conductive feature 120. The portion of the layer HL of accumulation of holes at interface between the MoSSe and air may serve as a channel CH2, like a 2DHG.

Figure 8C:
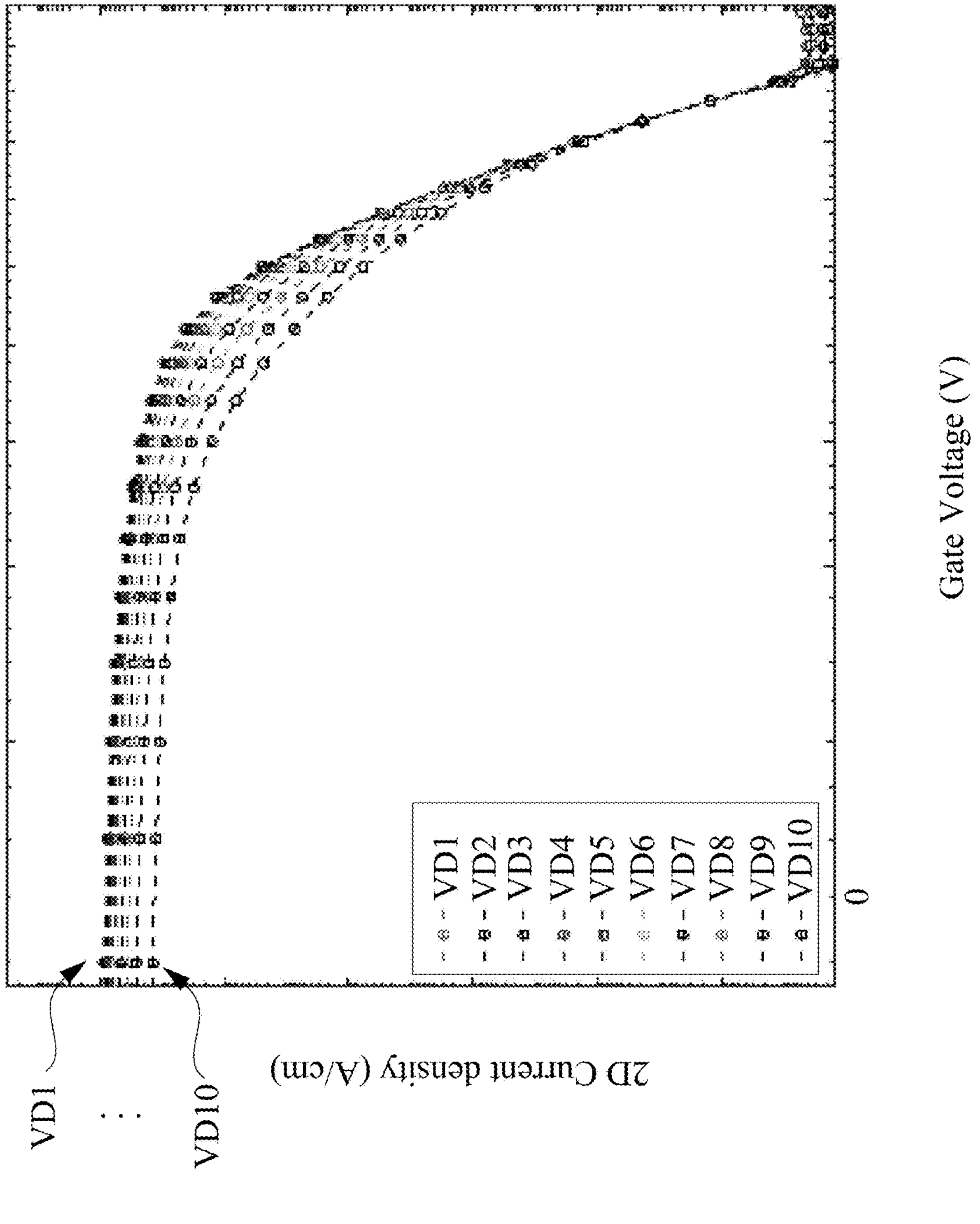
FIG. 8C shows curves of drain current versus gate bias voltage of the p-type transistor of the FIG. 8A.

FIG. 8C shows curves of drain current versus gate bias voltage of the p-type transistor of the FIG. 8A. The horizontal axis represents gate voltage, the vertical axis represents two-dimensional current density. Various curves with different drain voltages are shown as curves VD1-VD10, in which the drain voltages are negative and increasing (the absolute values thereof decrease) in a sequence from the curve VD1 to the curve VD10. In FIG. 8C, it is evidenced that the gate electrode 140 has the ability to control the channel CH2, a portion of the layer HL of accumulation of holes, and the transistor is normally on.

Figure 9A:
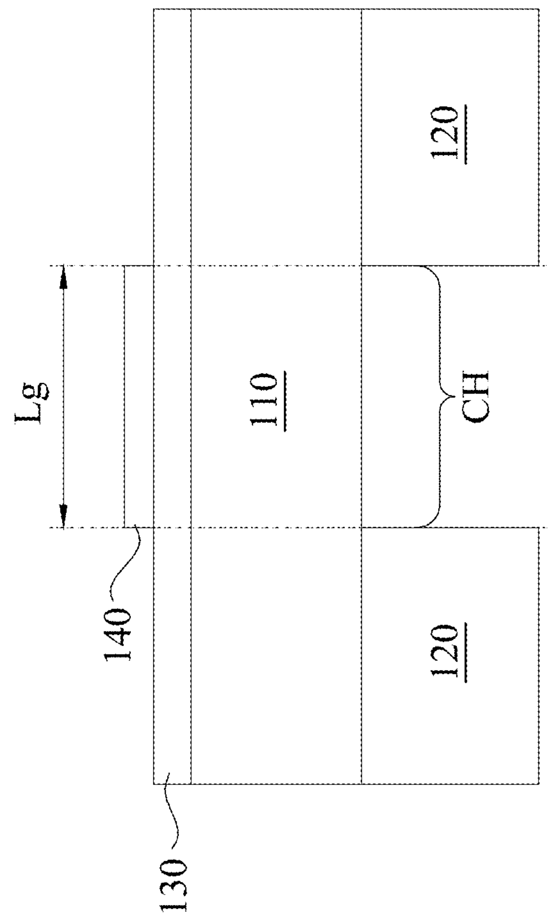
FIGS. 9A-9C are cross-sectional views of transistors including a Janus TMD layer according to some embodiments of the present disclosure.
Figure 9B:
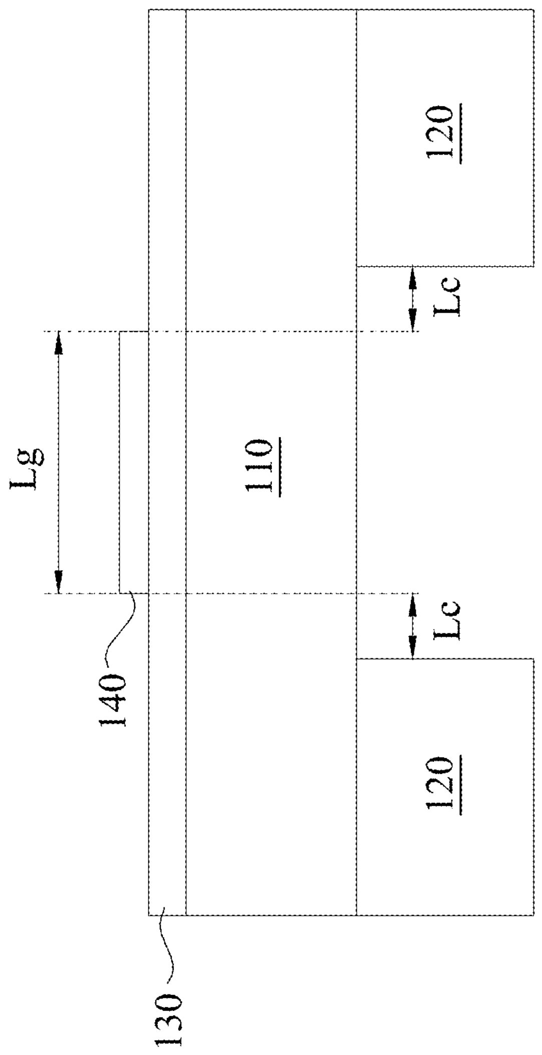
Figure 9C:
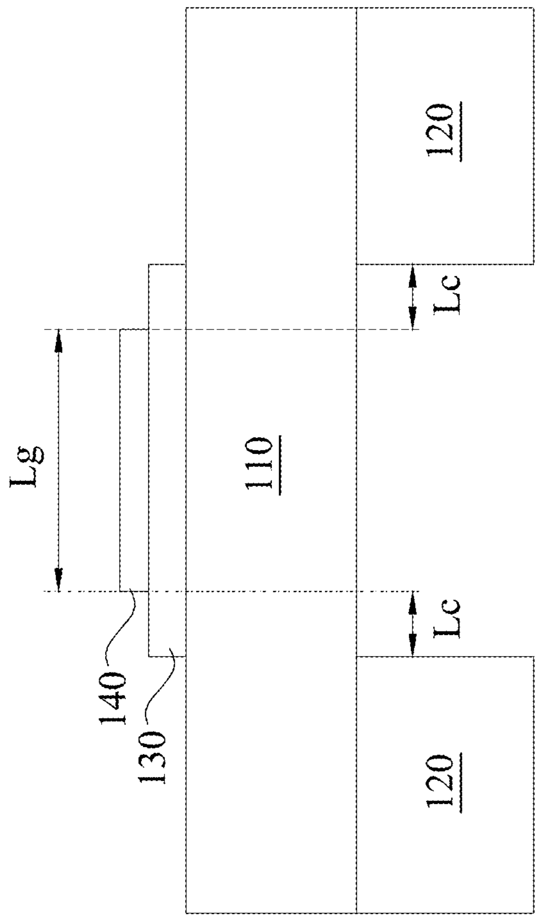

FIGS. 9A-9C are cross-sectional views of transistors including a Janus TMD layer according to some embodiments of the present disclosure. Details of the present embodiments are similar to that of FIGS. 5D and 6D, except that the gate electrode 140 and/or the dielectric layer 130 may have different configurations from that of the gate electrode 140 and/or the dielectric layer 130 of FIGS. 5D and 6D. In FIG. 9A, the length Lg of the gate electrode 140 is equal to the length of the channel CH (e.g., the channel CH1/CH2 between the conductive features 120, and the dielectric layer 130 covers an entirety of a side 110A/110B of the Janus TMD layer 110. In FIG. 9B, while the dielectric layer 130 covers an entirety of a side 110A/110B of the Janus TMD layer 110, the length Lg of the gate electrode 140 is less than the length of the channel CH (e.g., the channel CH1/CH2) between the conductive features 120. For example, opposite sides of the gate electrode 140 are spaced apart from the conductive features 120 by distances Lc. Details of embodiments of FIG. 9C are similar to that of FIG. 9B, except that the dielectric layer 130 merely covers a portion of the side 110A/110B of the Janus TMD layer 110, and uncovers other portions of the side 110A/110B of the Janus TMD layer 110. For example, the length of the dielectric layer 130 is equal to the length of the channel CH (e.g., the channel CH1/CH2) between the conductive features 120.

Figure 10A:
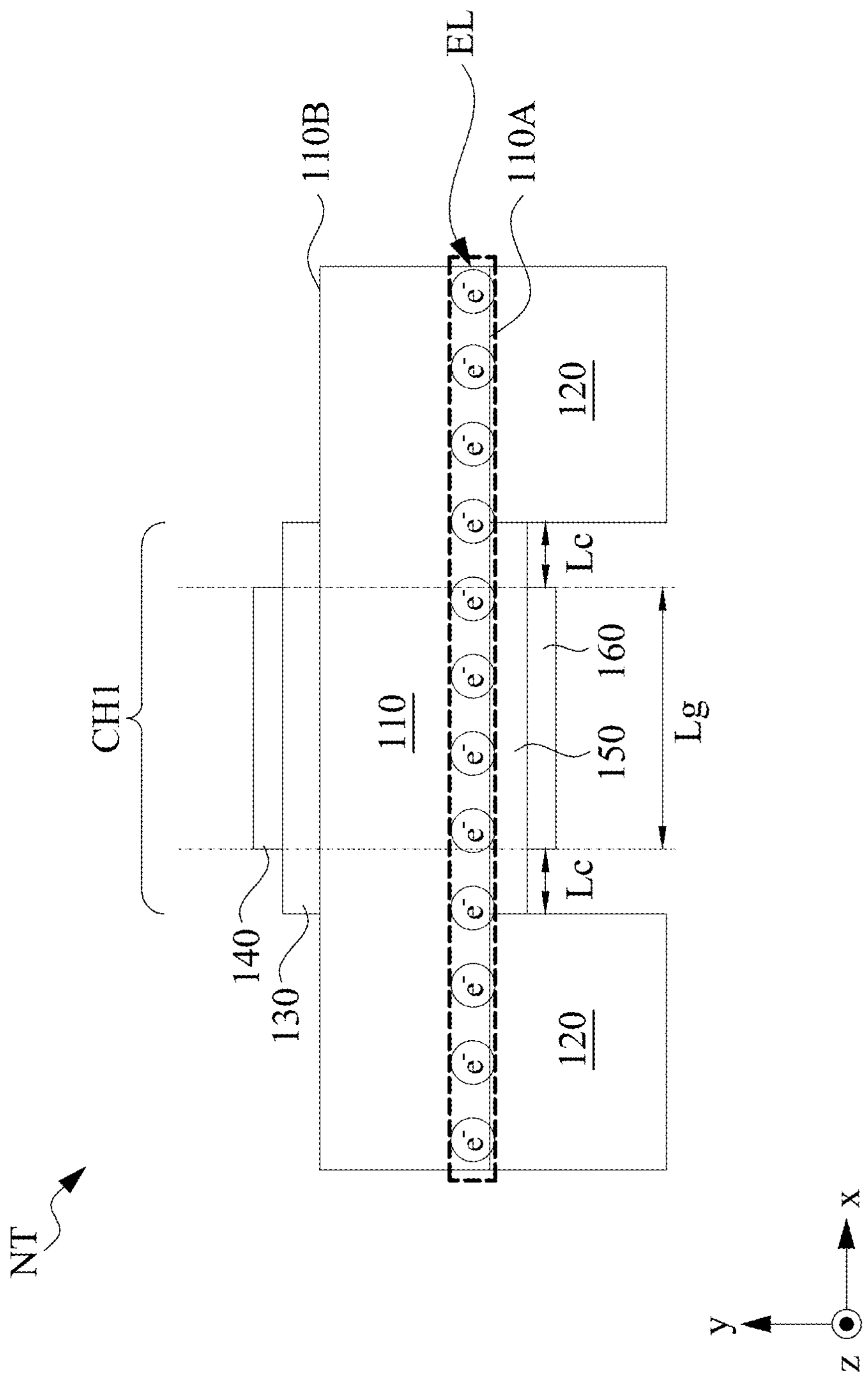
FIG. 10A is a cross-sectional view of an n-type dual-gate transistor including a Janus TMD layer according to some embodiments of the present disclosure.

FIG. 10A is a cross-sectional view of an n-type dual-gate transistor NT including a Janus TMD layer 110 according to some embodiments of the present disclosure. Details of embodiments of FIG. 10A are similar to that of FIG. 5D except that the n-type transistor NT have a dual-gate structure. The n-type transistor NT includes a Janus TMD layer 110, conductive features 120, a dielectric layer 130, a gate electrode 140, a dielectric layer 150, and a gate electrode 160. As illustrated in FIG. 10A, the Janus TMD layer 110 has a first side 110A adjoining a conductive feature 120 and the dielectric layer 150 and a second side 110B adjoining a dielectric layer 130. The dielectric layer 130 spaces the Janus TMD layer 110 from the gate electrode 140, and the dielectric layer 150 spaces the Janus TMD layer 110 from the gate electrode 160. As aforementioned, this intrinsic dipole in the Janus TMD layer 110 can produce accumulation of electrons at interface between the MoSSe and other materials (e.g., the conductive features 120 and the dielectric layer 150), which is illustrated as the layer EL of accumulation of electrons. In channel region (regions free of contacting the conductive feature 120), a portion of the layer EL of accumulation of electrons at interface between the MoSSe and the dielectric layer 150 may serve as a channel CH1, like a 2DEG. The channel CH1 may be normally on and can be controlled by the gate electrode 140. And, other portions of the layer EL of accumulation of electrons at interfaces between the MoSSe and the conductive feature 120 may be in direct contact with the conductive feature 120, thereby forming a n-type contact for the n-type transistor NT.

Figure 10D:
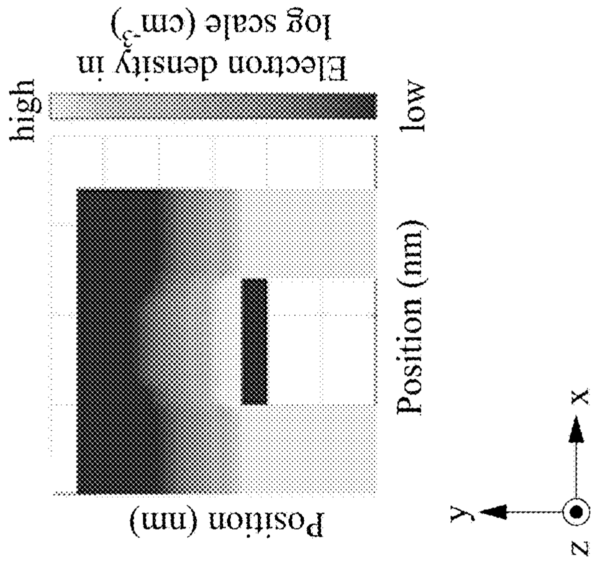
FIGS. 10B-10D show electron densities of the n-type dual-gate transistor of the FIG. 10A under different gate bias voltages.
Figure 10C:
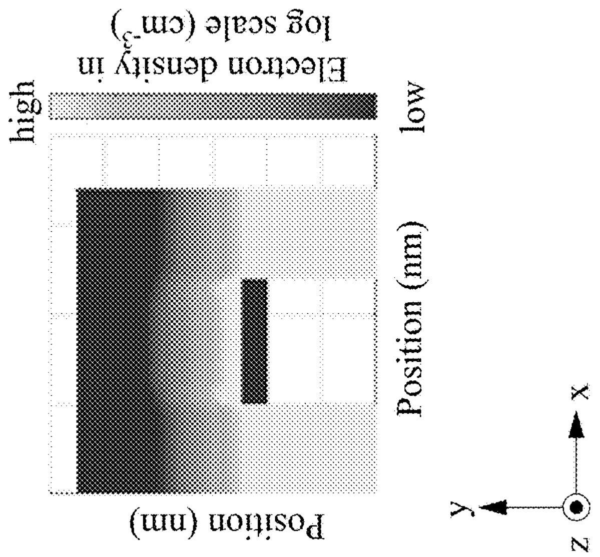
Figure 10B:
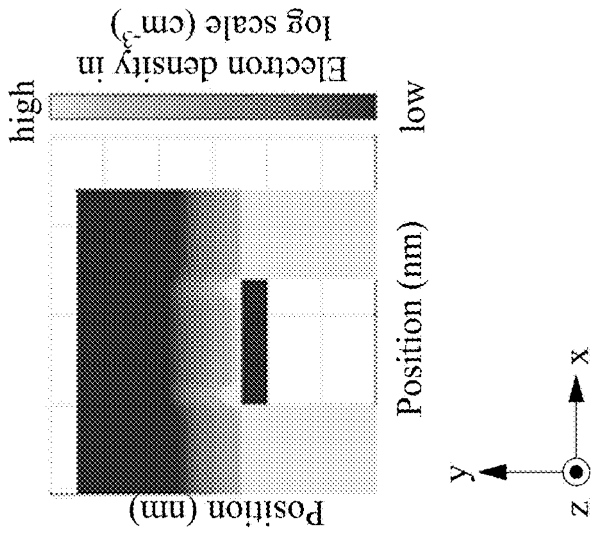

FIGS. 10B-10D show electron densities of the n-type dual-gate transistor NT of the FIG. 10A under different gate bias voltages. In FIG. 10B, a negative gate bias voltage is applied to turn off the channel CH1. In FIG. 10C, a zero gate bias voltage is applied, and the channel CH1 is normally on. In FIG. 10D, a positive gate bias voltage is applied to turn on the channel CH1, which has greater electron densities than that at zero gate bias voltage in FIG. 10C.

Figure 10E:
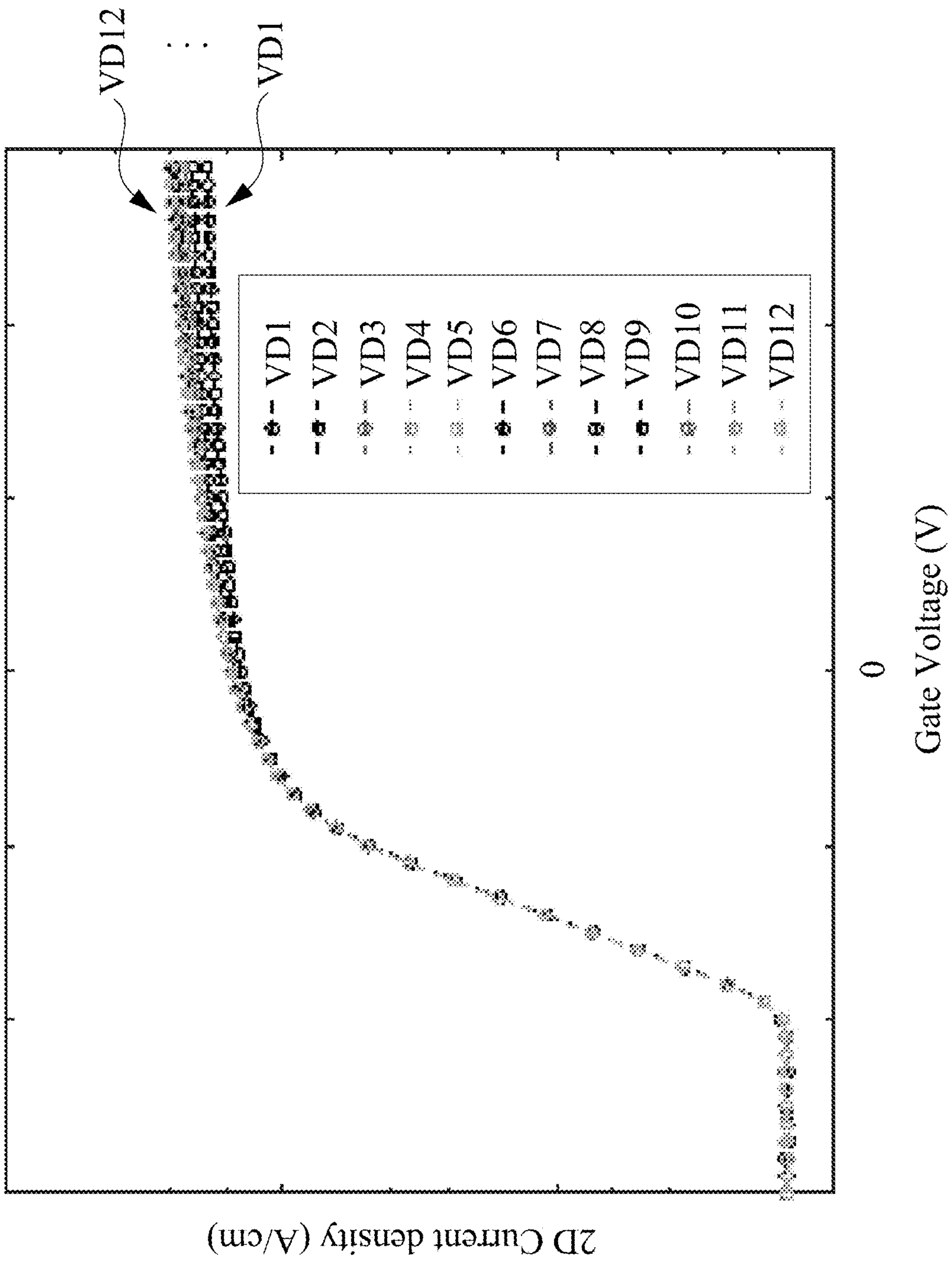
FIG. 10E shows curves of drain current versus gate bias voltage of the n-type dual-gate transistor of the FIG. 10A.

FIG. 10E shows curves of drain current versus gate bias voltage of the n-type dual-gate transistor NT of the FIG. 10A. The horizontal axis represents gate voltage, the vertical axis represents two-dimensional current density. Various curves with different drain voltages are shown as curves VD1-VD12, in which the drain voltages are positive and increasing in a sequence from the curve VD1 to the curve VD12. In FIG. 10E, it is evidenced that the duel-gate configuration (e.g., the gate electrodes 140 and 160) has a good ability to control the channel CH1, a portion of the layer EL of accumulation of electrons, and the transistor is normally on. With the duel-gate configuration, the n-type dual-gate transistor NT may show a low subthreshold swing (SS).

Figure 10F:
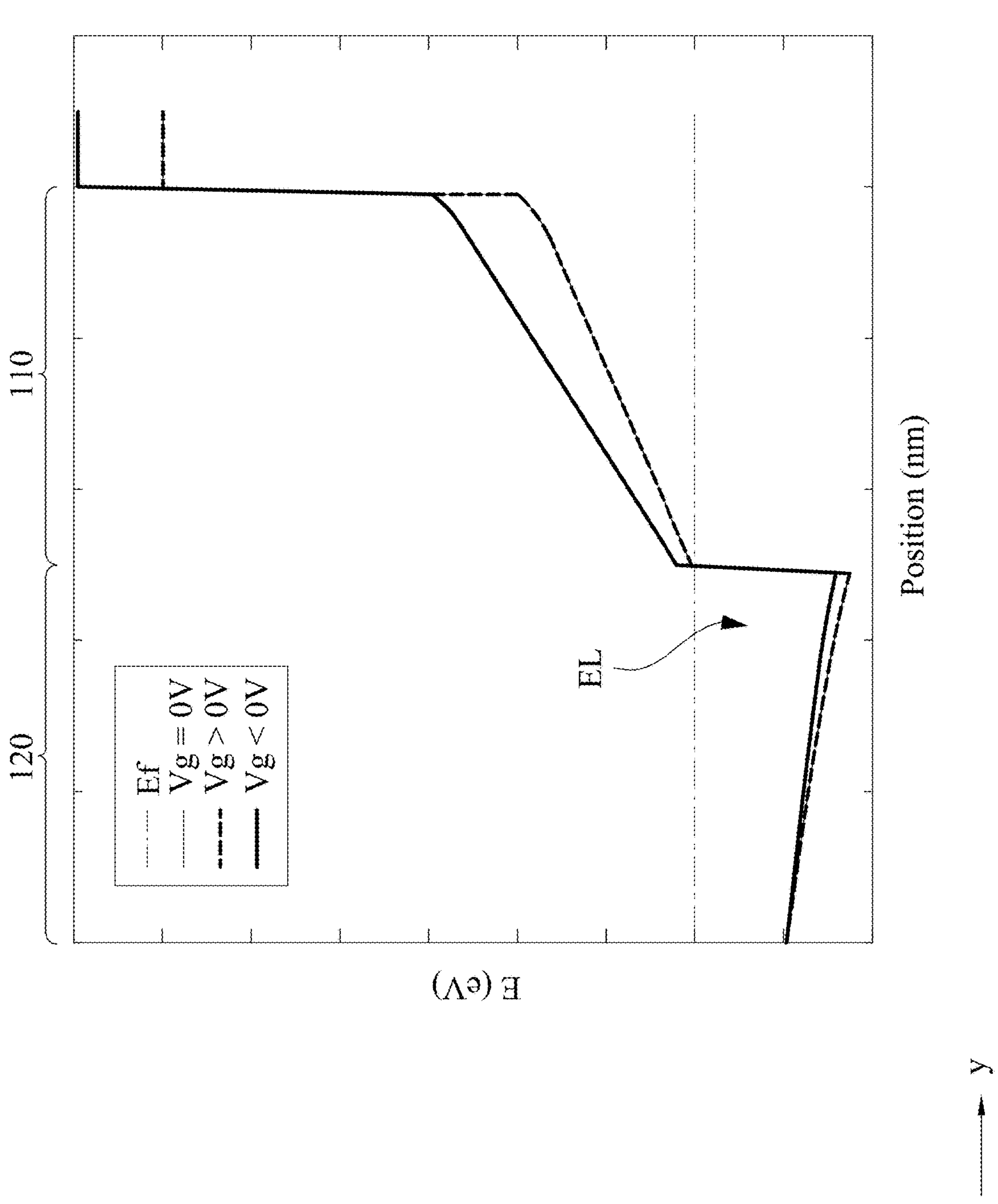
FIG. 10F is a band diagram of the n-type dual-gate transistor of FIG. 10A under different gate bias voltages at contacts.

FIG. 10F is a band diagram of the n-type dual-gate transistor of FIG. 10A under different gate bias voltages at contacts. The horizontal axis represents positions along y direction, and the vertical axis is energy. Conduction bands at zero gate vias voltage, positive gate bias voltage, and negative gate bias voltage are illustrated. Also, Fermi level (Ef) of the Janus TMD layer 110 is indicated in the figure. At interfaces between the Janus TMD layer 110 and the conductive feature 120, the region where the conduction bands are below the Fermi level of the Janus TMD layer 110 may be considered as the layer EL of accumulation of electrons. In some embodiments, the thickness of the layer EL of accumulation of electrons may be less than a thickness of the conductive feature 120 or equal to a thickness of the conductive feature 120.

Figure 10G:
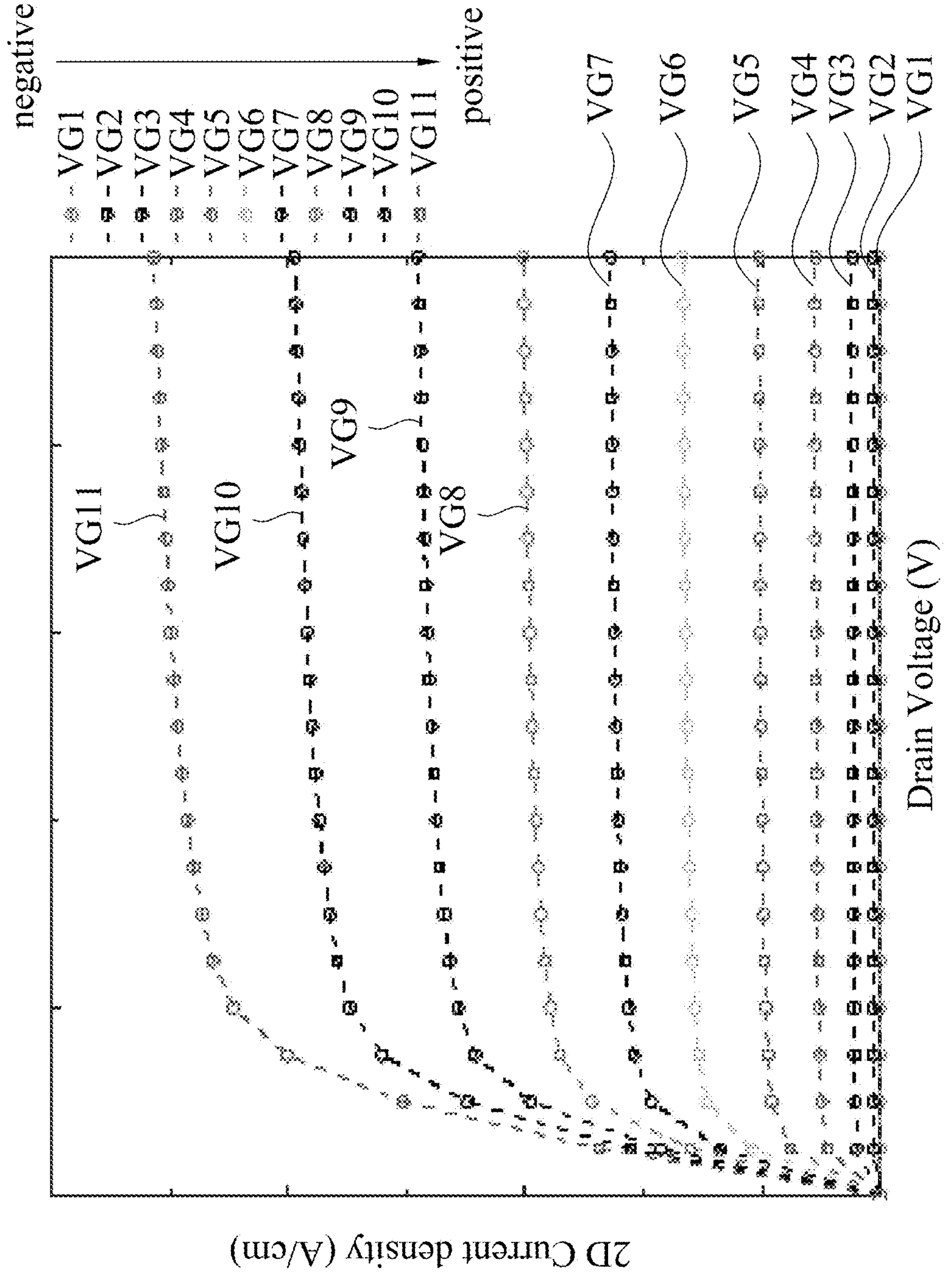
FIG. 10G shows curves of drain current versus drain voltage of the n-type dual-gate transistor of the FIG. 10A.

FIG. 10G shows curves of drain current versus drain voltage of the n-type dual-gate transistor of the FIG. 10A. The horizontal axis represents drain voltage, the vertical axis represents two-dimensional current density. Various curves with different gate voltages (VG) are shown. In FIG. 10G, it is evidenced that the duel-gate configuration (e.g., the gate electrodes 140 and 160) has a good ability to control the channel CH1.

Figure 10H:
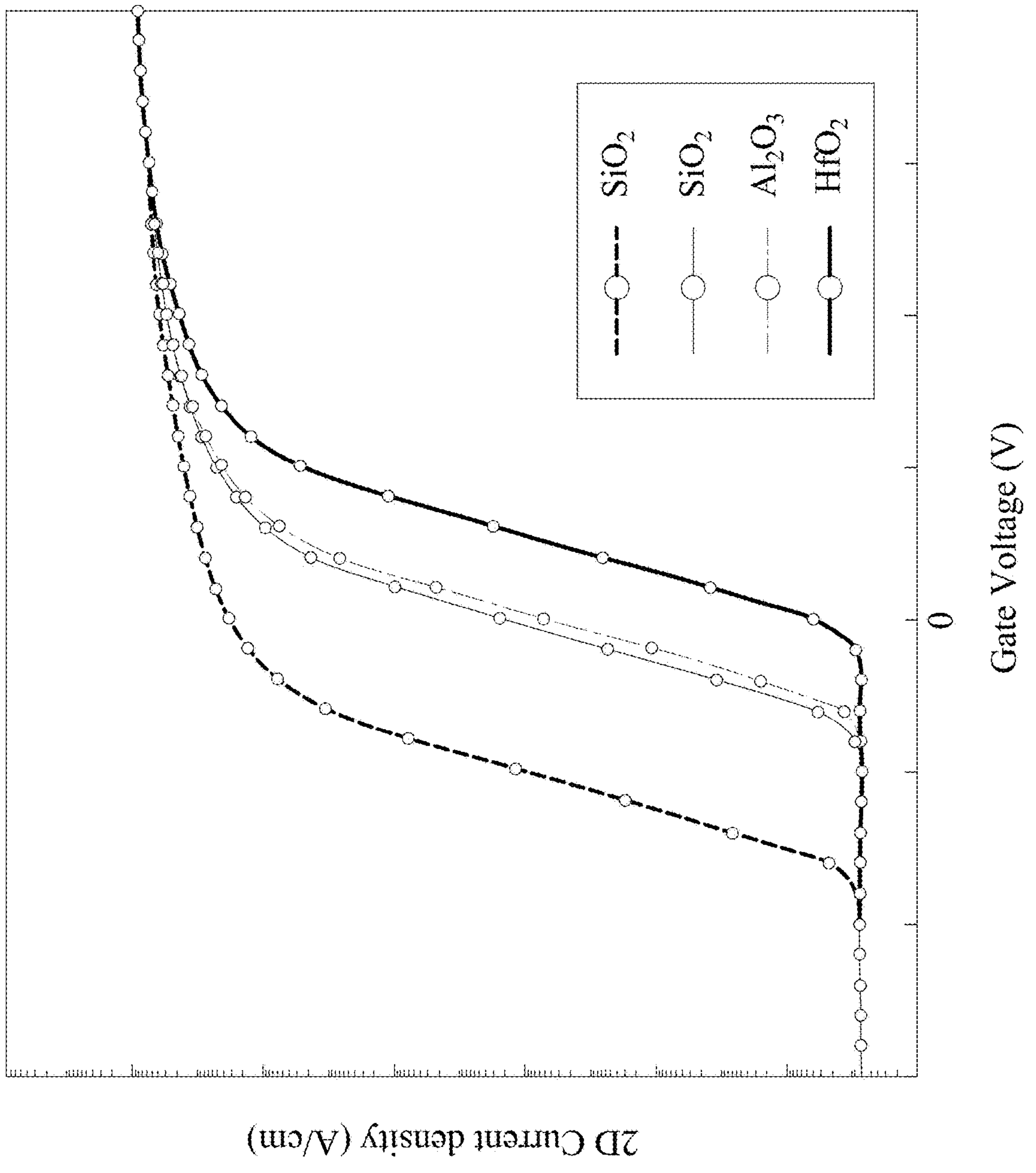
FIG. 10H shows curves of drain current versus gate bias voltage of various n-type dual-gate transistors including different gate dielectric materials according to some embodiments of the present disclosure.

FIG. 10H shows curves of drain current versus gate bias voltage of various n-type dual-gate transistors including different gate dielectric materials according to some embodiments of the present disclosure. The horizontal axis represents gate voltage, and the vertical axis represents two-dimensional current density. In some embodiments, $SiO_2$, high-k dielectrics (e.g., $HfO_2$, $Al_2O_3$), hBM, the like, or the combination thereof may be chosen for gate dielectric materials. Various curves with various materials (e.g., $SiO_2$, $HfO_2$, $Al_2O_3$) for the dielectric layers 130 and 150 are shown. In FIG. 10H, it is evidenced that the n-type dual-gate transistors with the high-k dielectric layer (e.g., $HfO_2$) having a thickness of about 0.5 nanometers to about 1.5 nanometers show an extremely low subthreshold swing (SS). The equivalent oxide thickness (EOT) of the dielectric layers 130 and 150 may be in a range from about 0.001 nm to about 10 um. For example, a range from 0.001 nm to about 0.21 nm may be chosen for enhanced mode (normally off), and a range from 0.21 nm to about 10 um may be chosen for passive mode (normally on.) If the EOT is greater than about 10 um, the n-type dual-gate transistors may not have the extremely low subthreshold swing (SS). If the EOT is less than about 0.001 nm, the dielectric layers 130 and 150 may be formed with defect or may not be a continuous film.

Figure 11A:
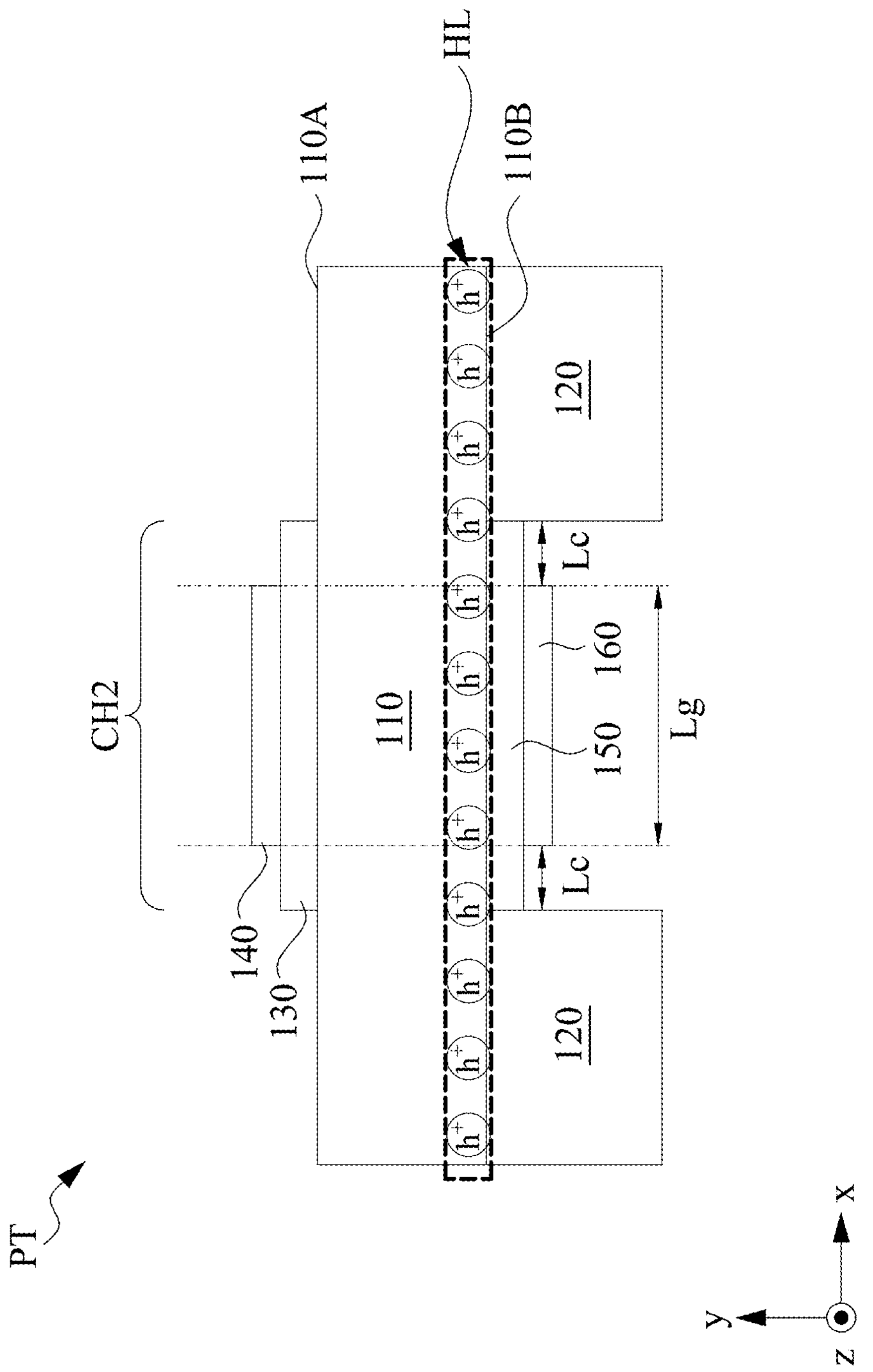
FIG. 11A is a cross-sectional view of a p-type dual-gate transistor including a Janus TMD layer according to some embodiments of the present disclosure.

FIG. 11A is a cross-sectional view of a p-type dual-gate transistor PT including a Janus TMD layer 110 according to some embodiments of the present disclosure. Details of embodiments of FIG. 11A are similar to that of FIG. 6D except that the p-type dual-gate transistor PT have a dual-gate structure. The p-type transistor PT includes a Janus TMD layer 110, conductive features 120, a dielectric layer 130, a gate electrode 140, a dielectric layer 150, and a gate electrode 160. As illustrated in FIG. 11A, the Janus TMD layer 110 has a first side 110A adjoining a dielectric layer 130 and a second side 110B adjoining a conductive feature 120 and the dielectric layer 150. The dielectric layer 130 spaces the Janus TMD layer 110 from the gate electrode 140, and the dielectric layer 150 spaces the Janus TMD layer 110 from the gate electrode 160. As aforementioned, this intrinsic dipole in the Janus TMD layer 110 can produce accumulation of holes at interface between the MoSSe and other materials (e.g., the conductive features 120 and the dielectric layer 150), which is illustrated as the layer HL of accumulation of holes. In channel region (regions free of contacting the conductive feature 120), a portion of the layer HL of accumulation of holes at interface between the MoSSe and the dielectric layer 150 may serve as a channel CH2, like a 2DHG. The channel CH2 may be normally on and can be controlled by the gate electrode 140. And, other portions of the layer HL of accumulation of holes at interfaces between the MoSSe and the conductive feature 120 may be in direct contact with the conductive feature 120, thereby forming a p-type contact for the p-type transistor PT.

Figure 11D:
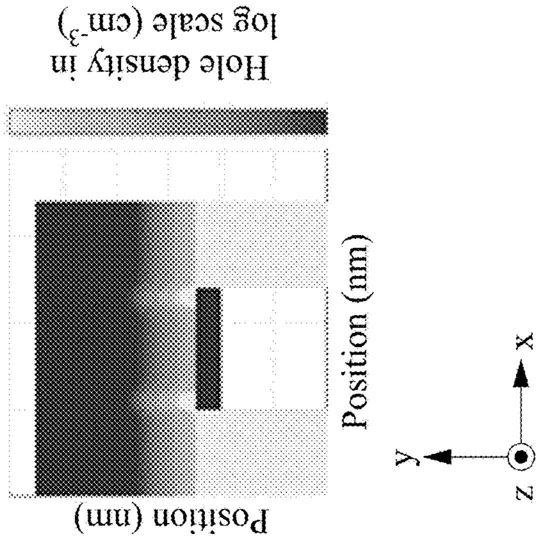
FIGS. 11B-11D show electron densities of the p-type dual-gate transistor of the FIG. 11A under different gate bias voltages.
Figure 11C:
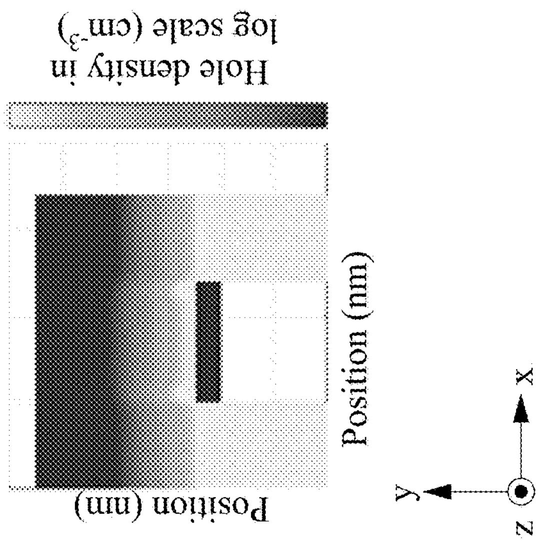
Figure 11B:
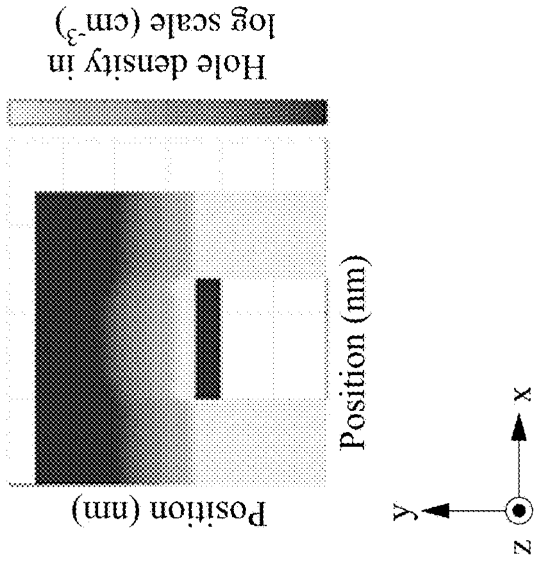

FIGS. 11B-11D show electron densities of the p-type dual-gate transistor of the FIG. 11A under different gate bias voltages. In FIG. 11C, a zero gate bias voltage is applied, and the channel CH2 is normally on. In FIG. 11B, a negative gate bias voltage is applied to turn on the channel CH2, which has greater hole densities than that at zero gate bias voltage in FIG. 11C. In FIG. 11D, a positive gate bias voltage is applied to turn off the channel CH2.

Figure 11E:
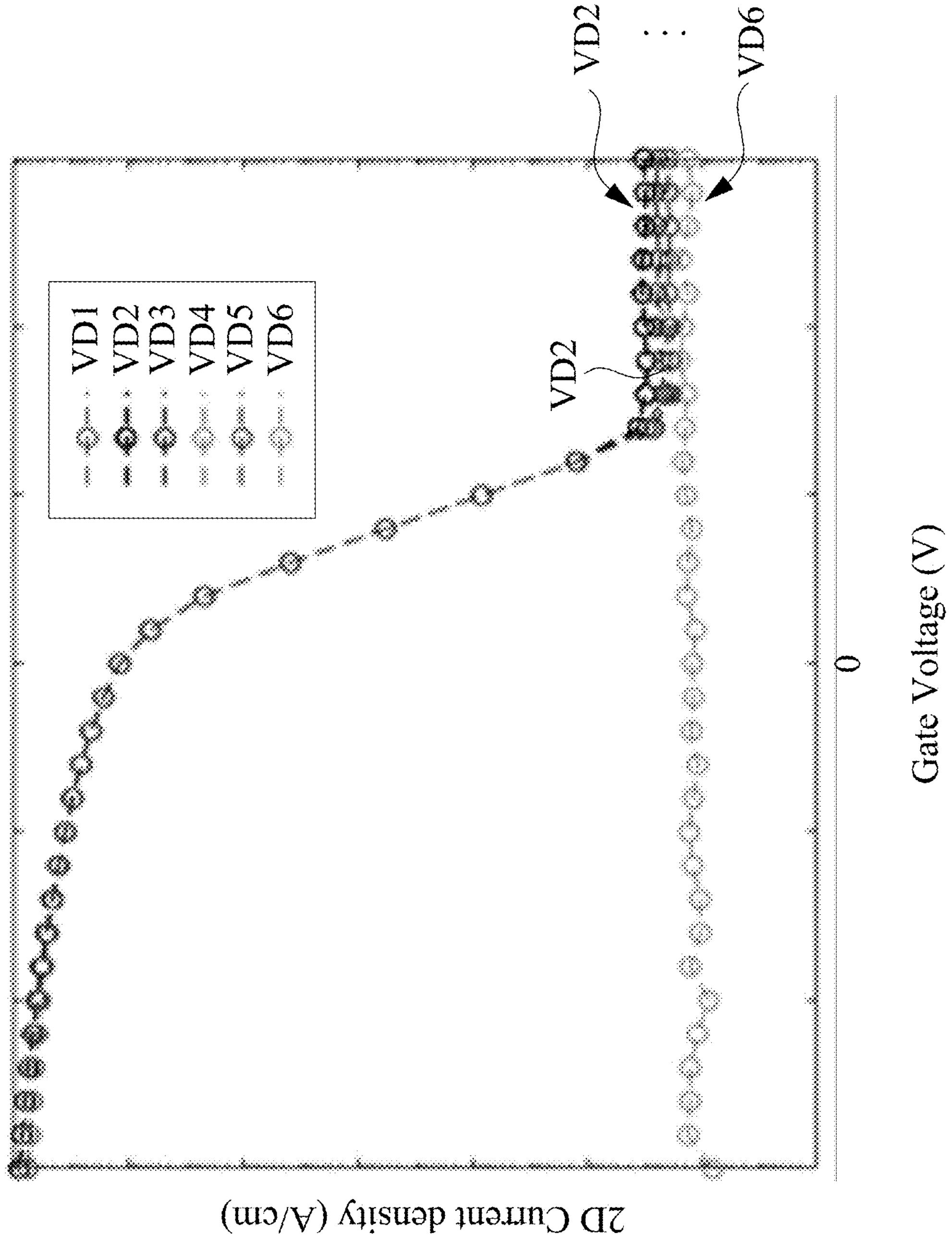
FIG. 11E shows curves of drain current versus gate bias voltage of the p-type dual-gate transistor of the FIG. 11A.

FIG. 11E shows curves of drain current versus gate bias voltage of the p-type dual-gate transistor of the FIG. 11A. The horizontal axis represents gate voltage, the vertical axis represents two-dimensional current density. Various curves with different drain voltages (VD) are shown. Various curves with different drain voltages are shown as curves VD1-VD6, in which the drain voltages of curves VD1-VD5 are negative, the drain voltage of curve VD6 is about zero and the drain voltages increases in a sequence from the curve VD1 to the curve VD6. In FIG. 11E, it is evidenced that the duel-gate configuration (e.g., the gate electrodes 140 and 160) has a good ability to control the channel CH2, a portion of the layer HL of accumulation of holes, and the transistor is normally on. With the duel-gate configuration, the p-type dual-gate transistor PT may show a low subthreshold swing (SS).

Figure 11F:
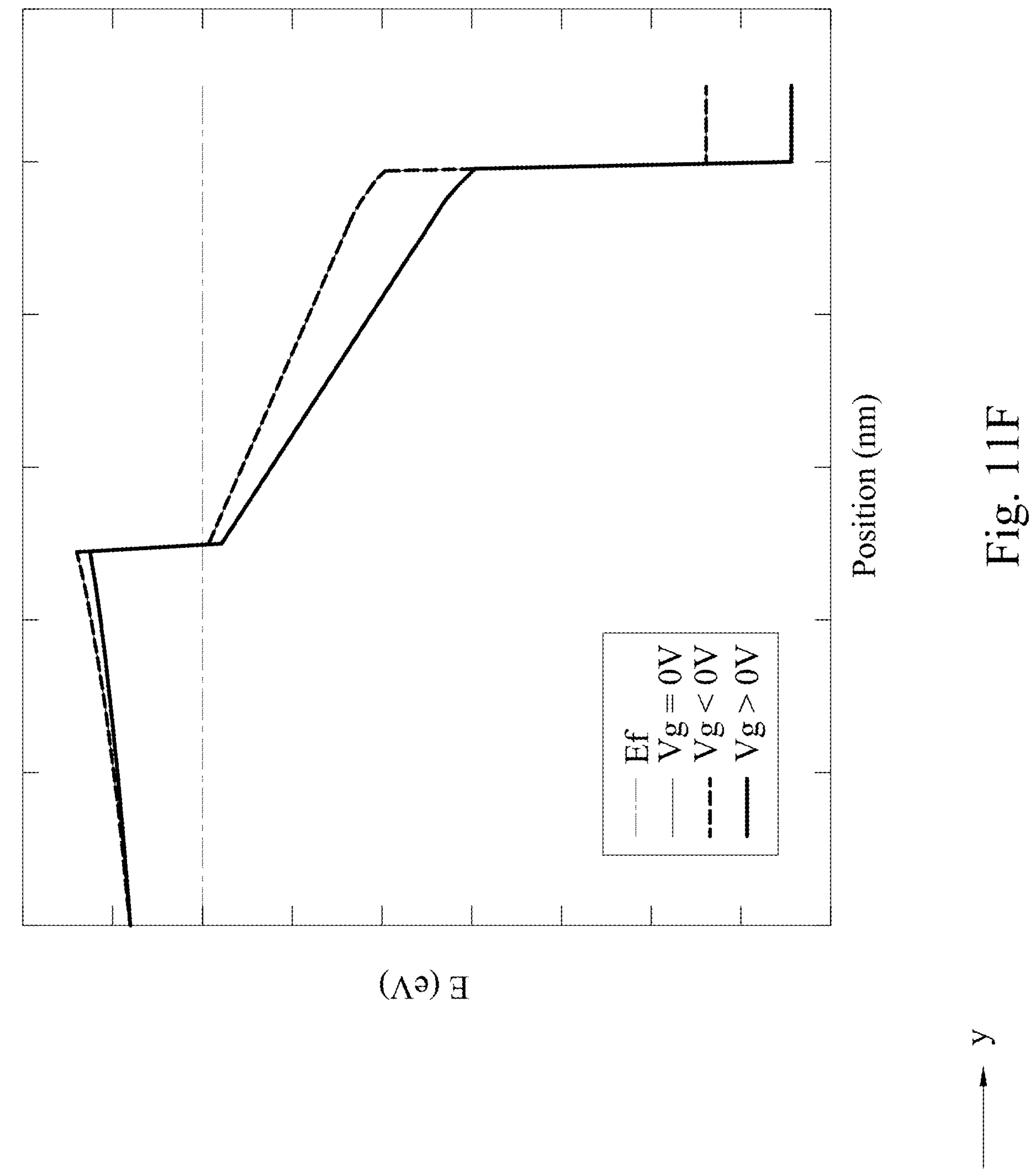
FIG. 11F is a band diagram of the p-type dual-gate transistor of FIG. 11A under different gate bias voltages.

FIG. 11F is a band diagram of the p-type dual-gate transistor of FIG. 11A under different gate bias voltages at contacts. The horizontal axis represents positions along y direction, and the vertical axis is energy. Valence bands at zero gate vias voltage, positive gate bias voltage, and negative gate bias voltage are illustrated. Also, Fermi level (Ef) of the Janus TMD layer 110 is indicated in the figure. At interfaces between the Janus TMD layer 110 and the conductive feature 120, the region where the valence bands are above the Fermi level of the Janus TMD layer 110 may be considered as the layer HL of accumulation of holes. In some embodiments, the thickness of the layer HL of accumulation of holes may be less than a thickness of the conductive feature 120 or equal to a thickness of the conductive feature 120.

Figure 11G:
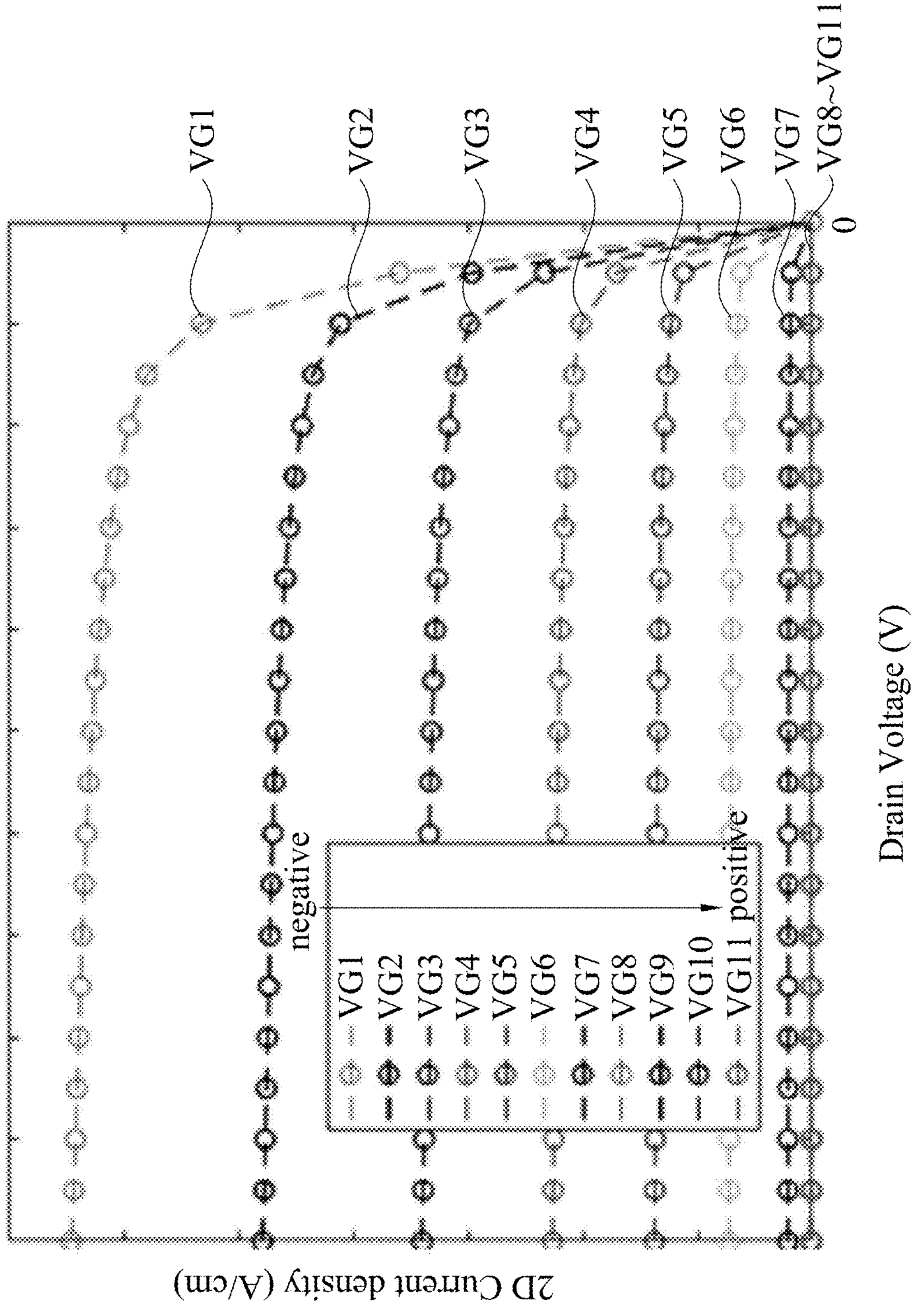
FIG. 11G shows curves of drain current versus drain voltage of the p-type dual-gate transistor of the FIG. 11A.

FIG. 11G shows curves of drain current versus drain voltage of the p-type dual-gate transistor of the FIG. 11A. The horizontal axis represents drain voltage, the vertical axis represents two-dimensional current density. Various curves with different gate voltages (VG) are shown. In FIG. 10G, it is evidenced that the duel-gate configuration (e.g., the gate electrodes 140 and 160) has a good ability to control the channel CH1.

Figure 11H:
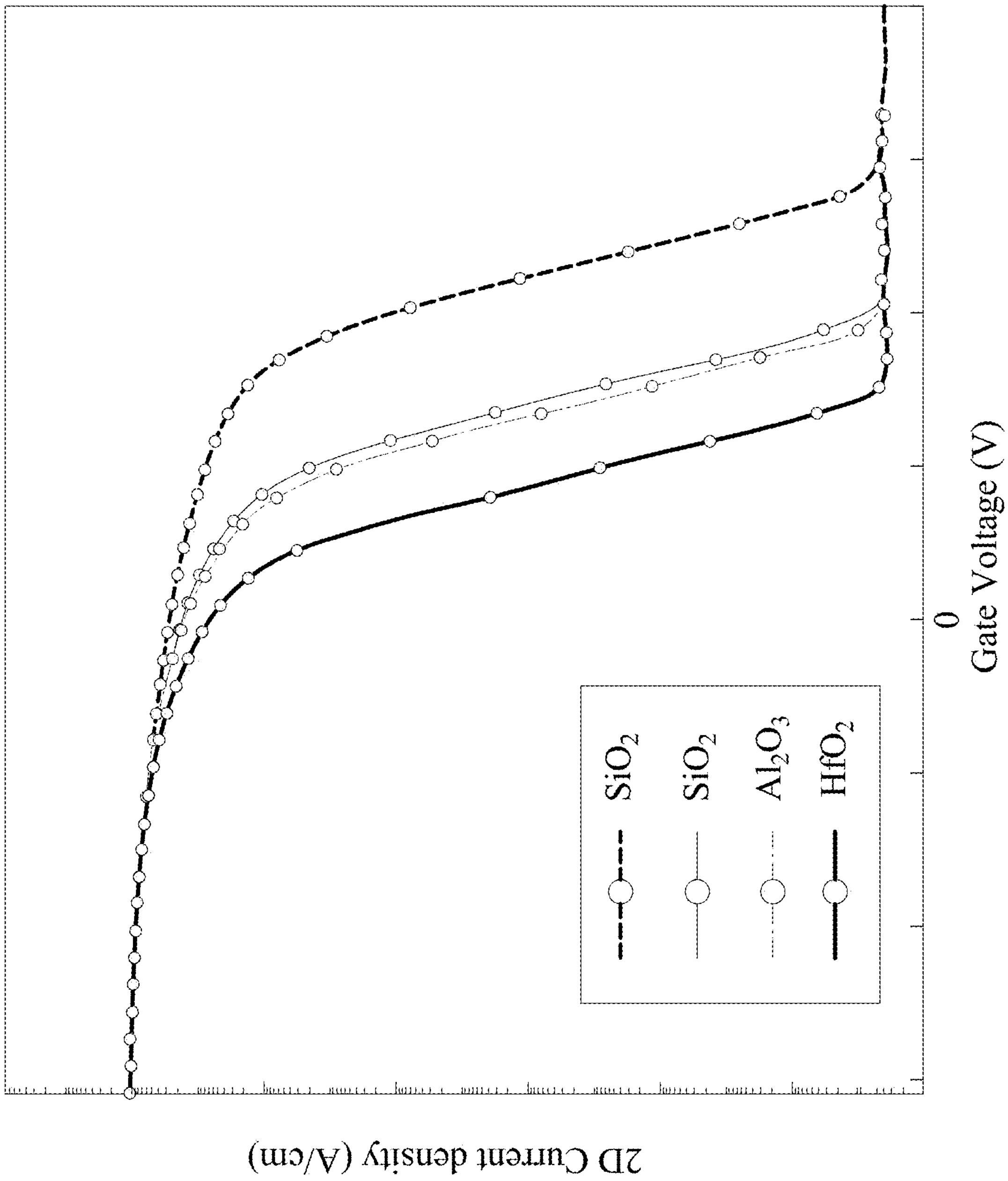
FIG. 11H shows curves of drain current versus gate bias voltage of various p-type dual-gate transistors including different gate dielectric materials according to some embodiments of the present disclosure.

FIG. 11H shows curves of drain current versus gate bias voltage of various p-type dual-gate transistors including different gate dielectric materials according to some embodiments of the present disclosure. The horizontal axis represents gate voltage, the vertical axis represents two-dimensional current density. Various curves with various materials (e.g., $SiO_2$, $HfO_2$, $Al_2O_3$) for the dielectric layers 130 and 150 are shown. In FIG. 11H, it is evidenced that the n-type dual-gate transistor with the $HfO_2$ dielectric layer having a thickness of about 0.5 nanometers to about 1.5 nanometers shows an extremely low subthreshold swing (SS). The equivalent oxide thickness (EOT) of the dielectric layers 130 and 150 may be in a range from about 0.001 nm to about 10 um. For example, a range from 0.001 nm to about 0.21 nm may be chosen for enhanced mode (normally off), and a range from 0.21 nm to about 10 um may be chosen for passive mode (normally on.) If the EOT is greater than about 10 um, the p-type dual-gate transistors may not have the extremely low subthreshold swing (SS). If the EOT is less than about 0.001 nm, the dielectric layers 130 and 150 may be formed with defect or may not be a continuous film.

Figure 12:
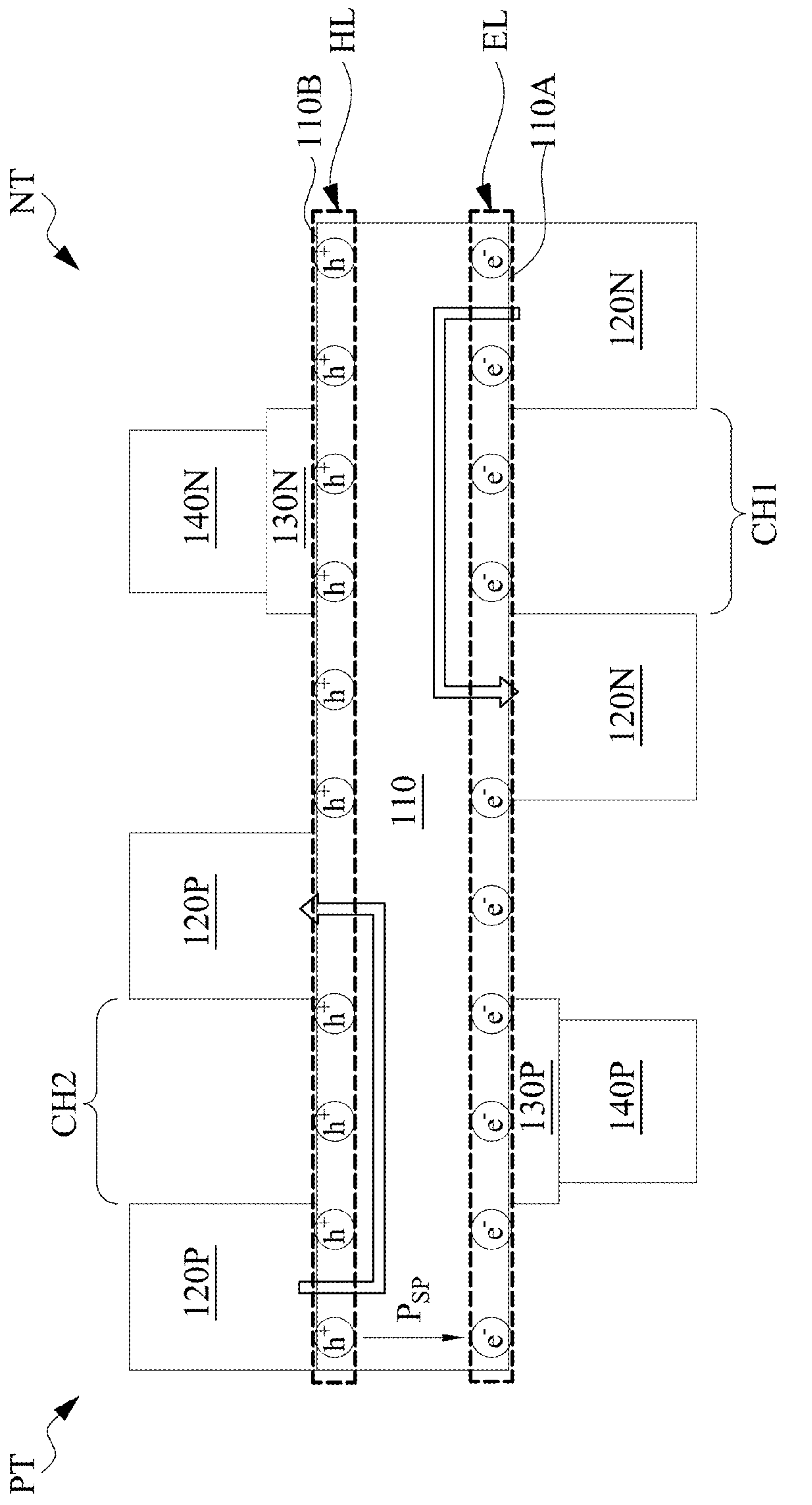
FIG. 12 is a cross-sectional view of an integrated circuit device including a n-type device and a p-type device according to some embodiments of the present disclosure.

FIG. 12 is a cross-sectional view of an integrated circuit device including a n-type device NT and a p-type device PT according to some embodiments of the present disclosure. The n-type device NT and the p-type device PT may use the same single Janus TMD layer 110. It is not necessary to doping and do some material modification since the contact resistivity problem can be solved by JTMD/Metal contact. In FIG. 12, the conductive features 120, the dielectric layer 130, and the gate electrode 140 are denoted as conductive features 120N, the dielectric layer 130N, and the gate electrode 140N for the n-type device NT, and conductive features 120P, the dielectric layer 130P, and the gate electrode 140P for the p-type device PT. The dielectric layer 130N and the gate electrode 140N may serve as a gate structure for the n-type device NT. The dielectric layer 130P and the gate electrode 140P may serve as a gate structure for the p-type device PT. For example, the layer EL of accumulation of electrons at the side 110A of the Janus TMD layer 110 may form a channel CH1 between the conductive features 120N. The layer HL of accumulation of holes at the side 110B of the Janus TMD layer 110 may form a channel CH2 between the conductive features 120P. In the present embodiments, the p-FET and n-FET are achieved using single material rather than two different 2D material combination.

Figure 13:
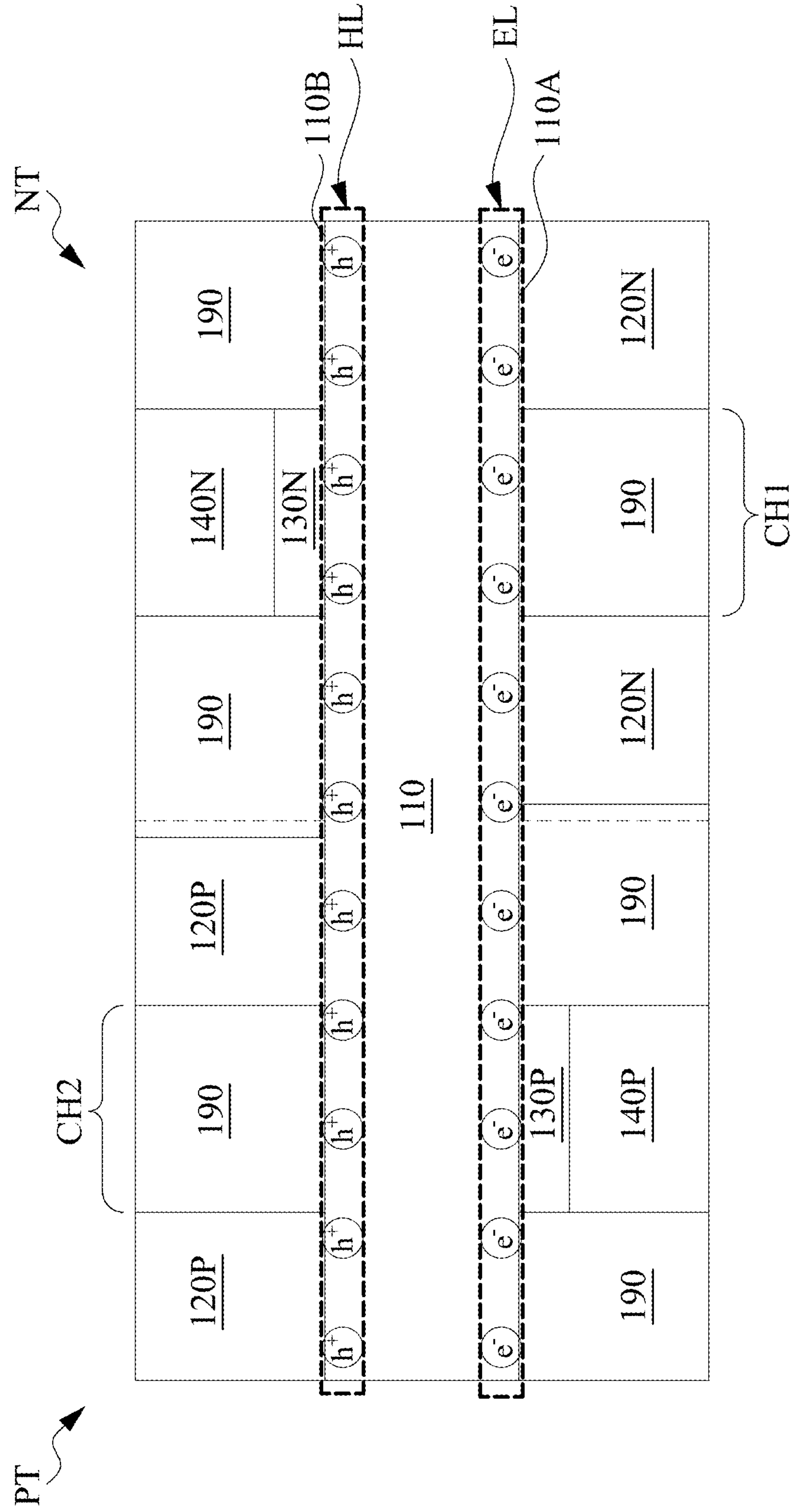
FIG. 13 is a cross-sectional view of an integrated circuit device including a n-type device and a p-type device according to some embodiments of the present disclosure.

FIG. 13 is a cross-sectional view of an integrated circuit device including a n-type device and a p-type device according to some embodiments of the present disclosure. Details of the present embodiments are similar to that of FIG. 12, except that a filler material 190 is formed in the spaces around the conductive features 120N, 120P, the dielectric layer 130N, 130P, and the gate electrode 140N, 140P. The filler material 190 may include $SiO_2$, $HfO_2$, poly (methyl methacrylate) (PMMA), the like, or combination thereof. Other details of the present embodiments are similar to that of FIG. 12, and therefore not repeated herein.

Figure 14:
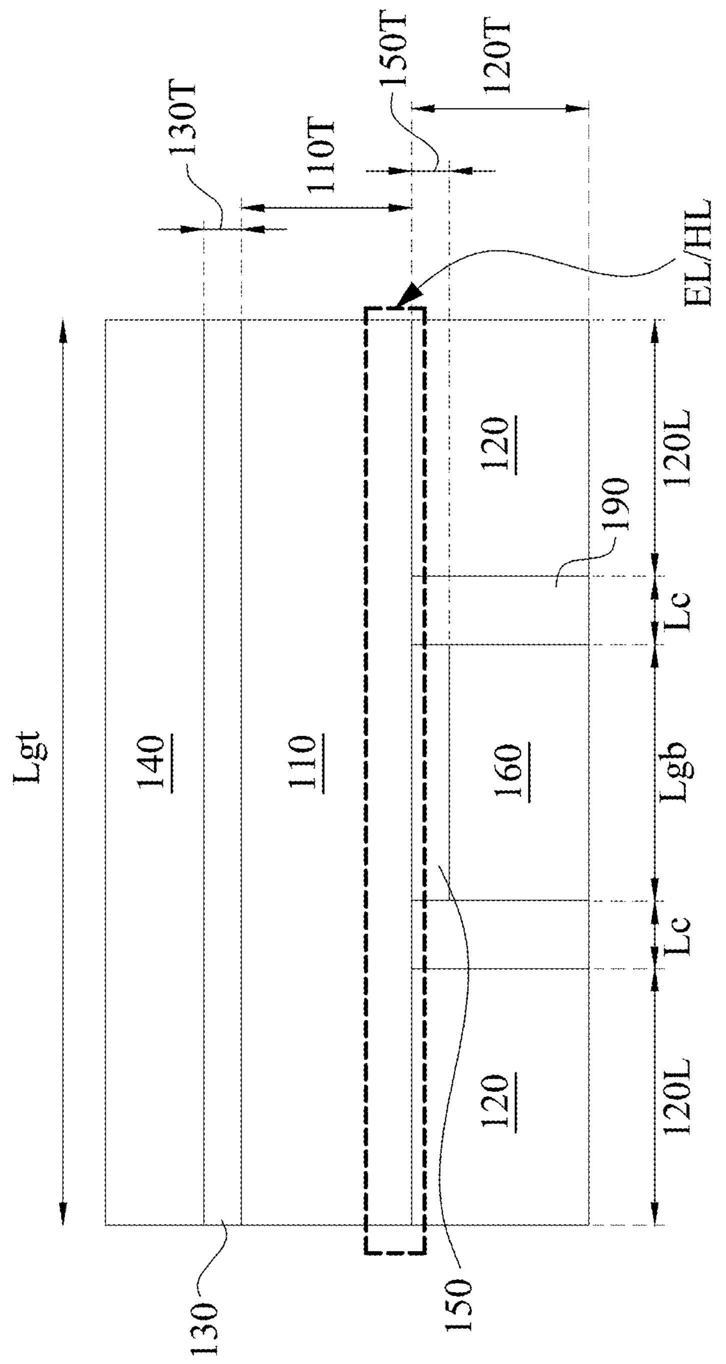
FIG. 14 is a cross-sectional view of a dual-gate transistor including a Janus TMD layer according to some embodiments of the present disclosure.

FIG. 14 is a cross-sectional view of a dual-gate transistor including a Janus TMD layer according to some embodiments of the present disclosure. The dual-gate transistor can serve as an n-type transitory or a p-type transistor depending on directions of dipole in the Janus TMD layer 110. The length Lgt of the gate electrode 140, the length Lgb of the gate electrode 160, the distances Lc between the gate electrode 160 and the conductive features 120, the lengths 120L and thicknesses 120T of the conductive features 120 can be in range from about 1 nm to about 100 um due to the processing ability. The thickness 110T of the Janus TMD layer 110 may be in range from about 1 nm to about 100 um. The Janus TMD layer 110 may include plural layers of Janus TMD layers, such as one layer to eight layers. If the thickness 110T of the Janus TMD layer 110 is greater than about 100 um, the device may be enlarged unnecessarily. If the thickness 110T of the Janus TMD layer 110 is less than about 1 nm, the Janus TMD layer 110 may be formed with defect or may not be a continuous film. In some embodiments where the dielectric layers 130 and 150 are $HfO_2$, the thickness 130T of the dielectric layer 130 and the thickness 150T of the dielectric layer 150 may be in a range from about 0.5 nm to about 10 um. If the thickness 130T and thickness 150T are greater than about 10 um, the transistors may not have the extremely low subthreshold swing (SS). If the thickness 130T and thickness 150T are less than about 0.5 nm, the $HfO_2$ dielectric layers 130 and 150 may be formed with defect or may not be a continuous film.

Figure 15A:
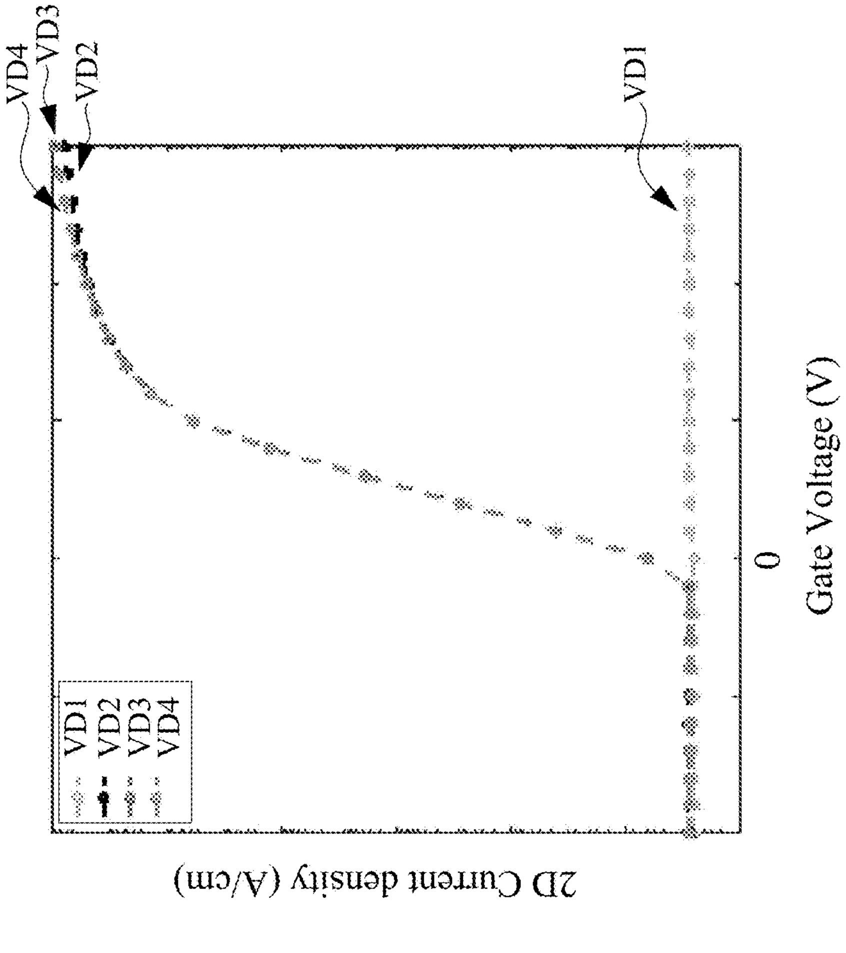
FIG. 15A shows curves of drain current versus gate bias voltage of the n-type dual-gate transistor of the FIG. 14.
Figure 15B:
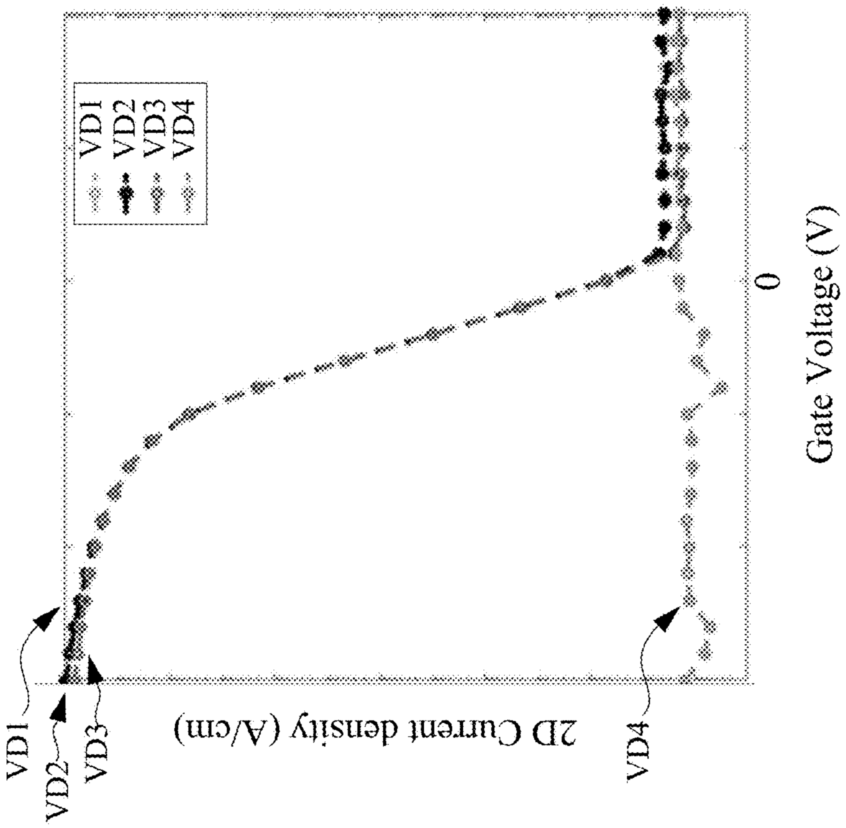
FIG. 15B shows curves of drain current versus gate bias voltage of the p-type dual-gate transistor of the FIG. 14.

FIG. 15A shows curves of drain current versus gate bias voltage of the n-type dual-gate transistor of the FIG. 14. FIG. 15B shows curves of drain current versus gate bias voltage of the p-type dual-gate transistor of the FIG. 14. In FIGS. 15A and 15B, the horizontal axis represents gate voltage, the vertical axis represents two-dimensional current density. In FIG. 15A, various curves with different drain voltages are shown as curves VD1-VD4, in which the drain voltage of the curves VD1 is about zero, the drain voltages of the curves VD2-VD4 are positive, and the drain voltages increases in a sequence from the curve VD1 to the curve VD4. In FIG. 15B, various curves with different drain voltages are shown as curves VD1-VD4, in which the drain voltage of the curves VD4 is about zero, the drain voltages of the curves VD1-VD3 are negative, and the drain voltages increases in a sequence from the curve VD1 to the curve VD4. In FIGS. 15A-15B, it is evidenced that the n-type and p-type dual gate transistors using the same dimensions for elements thereof (e.g., same top and bottom gate lengths) have similar curves of drain current versus gate bias voltage, and both have low SS.

Figure 16B:
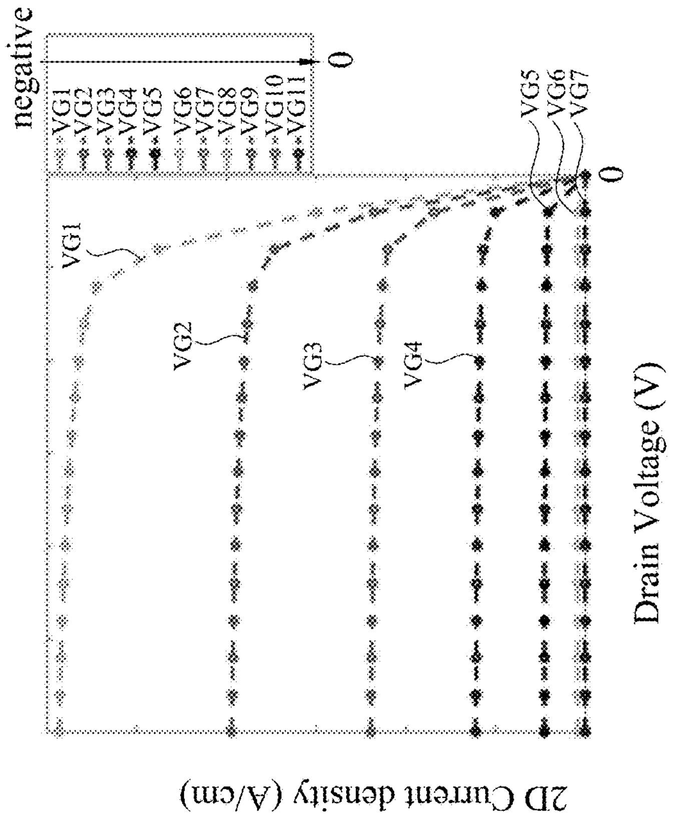
FIG. 16B shows curves of drain current versus drain voltage of the p-type dual-gate transistor of the FIG. 14.
Figure 16A:
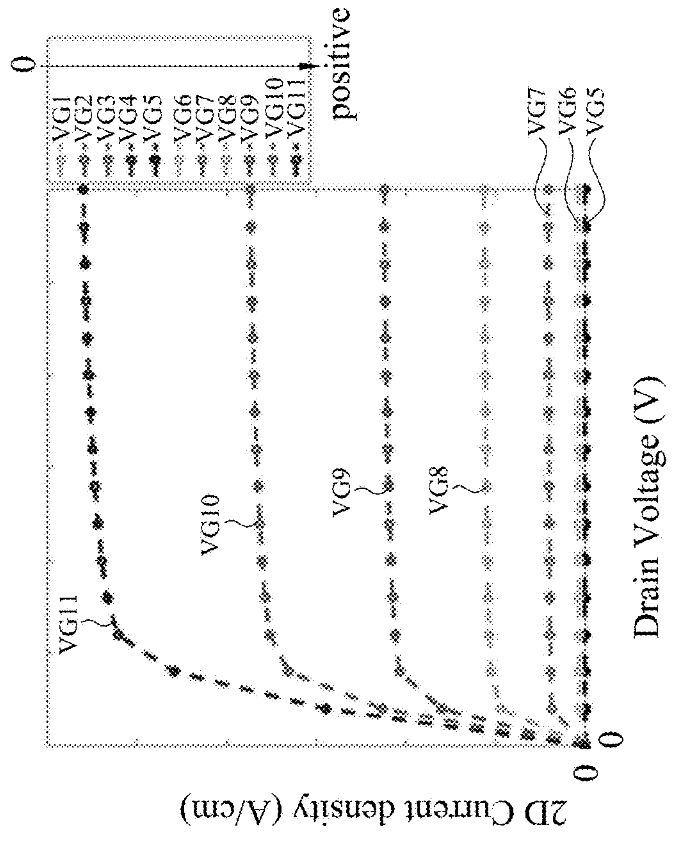
FIG. 16A shows curves of drain current versus drain voltage of the n-type dual-gate transistor of the FIG. 14.

FIG. 16A shows curves of drain current versus drain voltage of the n-type dual-gate transistor of the FIG. 14. FIG. 16B shows curves of drain current versus drain voltage of the p-type dual-gate transistor of the FIG. 14. In FIGS. 16A and 16B, the horizontal axis represents drain voltage, the vertical axis represents two-dimensional current density. Various curves with different gate voltages (VG) are shown. In FIGS. 15A-16B, both n-type and p-type dual gate transistors with the same top and bottom gate lengths almost have the same saturated current.

Figure 17:
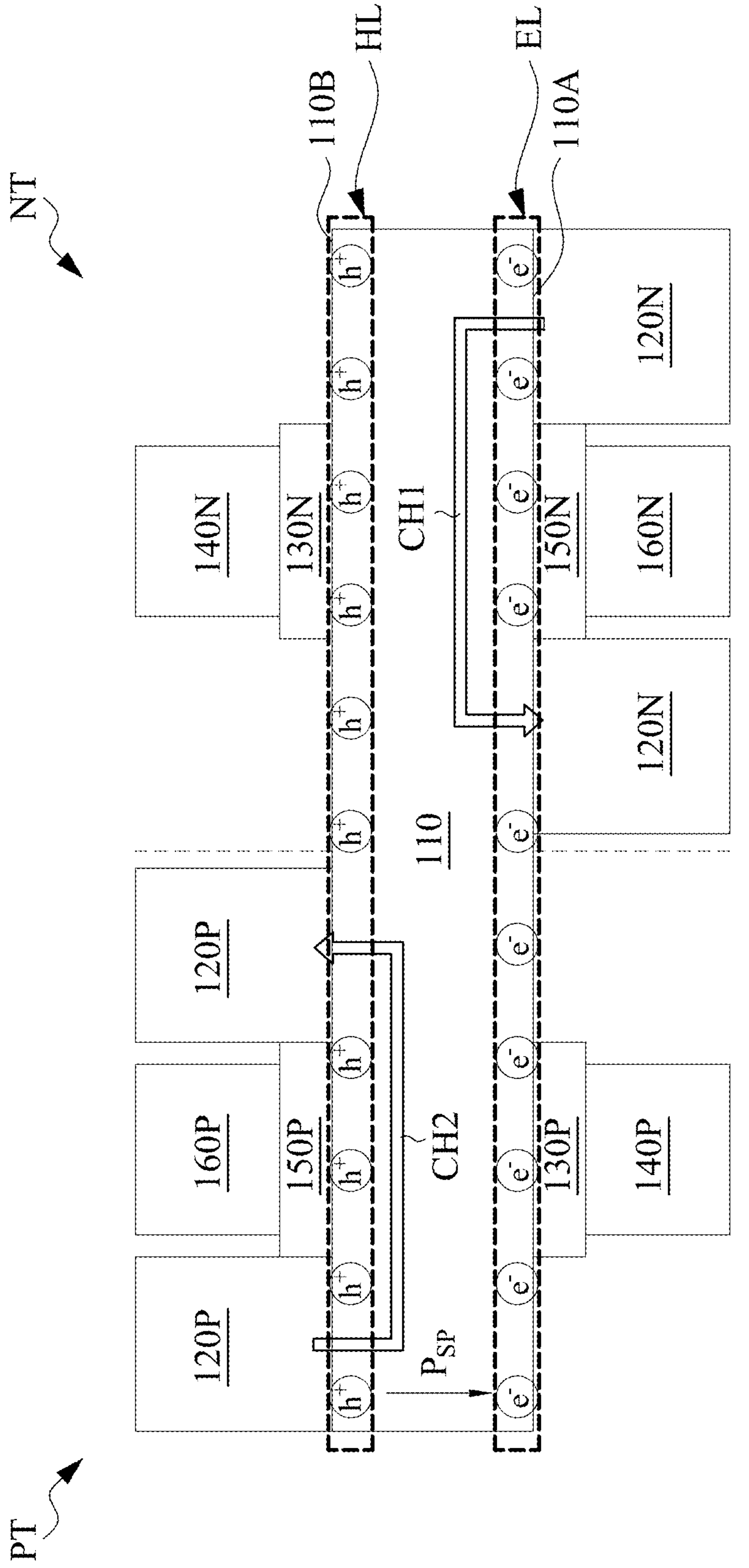
FIG. 17 is a cross-sectional view of an integrated circuit device including a n-type device and a p-type device according to some embodiments of the present disclosure.

FIG. 17 is a cross-sectional view of an integrated circuit device including a n-type device and a p-type device according to some embodiments of the present disclosure. Details of the present embodiments are similar to those illustrated in FIG. 12, except that the n-type transistor NT and the p-type transistor PT have dual-gate structures. The dual-gate structures for the n-type transistor NT and the p-type transistor PT may adopts the same dimensions for elements thereof, as illustrated in FIGS. 14-16B. In FIG. 17, the conductive features 120, the dielectric layer 130, the gate electrode 140, the dielectric layer 150, and the gate electrode 160 are denoted as conductive features 120N, the dielectric layer 130N, the gate electrode 140N, the dielectric layer 150N, and the gate electrode 160N for the n-type device NT, and conductive features 120P, the dielectric layer 130P, and the gate electrode 140P, the dielectric layer 150P, and the gate electrode 160P for the p-type device PT. For example, the layer EL of accumulation of electrons at the side 110A of the Janus TMD layer 110 may form a channel CH1 between the conductive features 120N. The layer HL of accumulation of holes at the side 110B of the Janus TMD layer 110 may form a channel CH2 between the conductive features 120P. In the present embodiments, the p-FET and n-FET are achieved using single material rather than two different 2D material combination.

Figure 18:
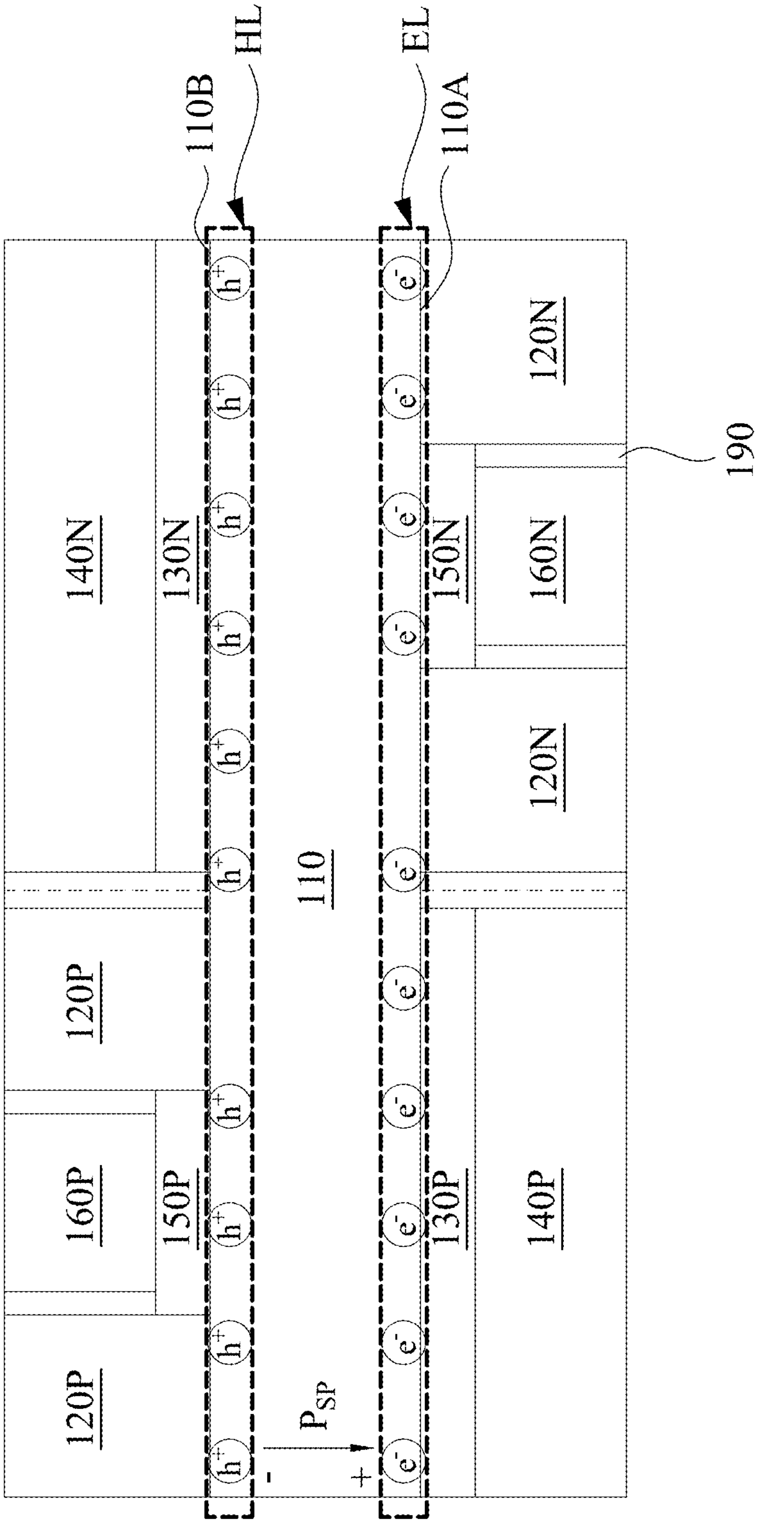
FIG. 18 is a cross-sectional view of an integrated circuit device including a n-type device and a p-type device according to some embodiments of the present disclosure.

FIG. 18 is a cross-sectional view of an integrated circuit device including a n-type device and a p-type device according to some embodiments of the present disclosure. Details of the present embodiments are similar to those illustrated in FIG. 17, except that filler material 190 is formed in the spaces around the conductive features 120N, 120P, the dielectric layer 130N, 130P, the gate electrode 140N, 140P, the dielectric layer 150N. 150P, and the gate electrode 160N, 160P. The filler material 190 may include $SiO_2$. $HfO_2$, poly (methyl methacrylate) (PMMA), the like, or combination thereof. In some embodiments, the filler material 190 may be added with nano metal wires therein, thereby connecting drain regions between two transistors NT and PT. Other details of the present embodiments are similar to that of FIG. 12, and therefore not repeated herein.

Figure 19:
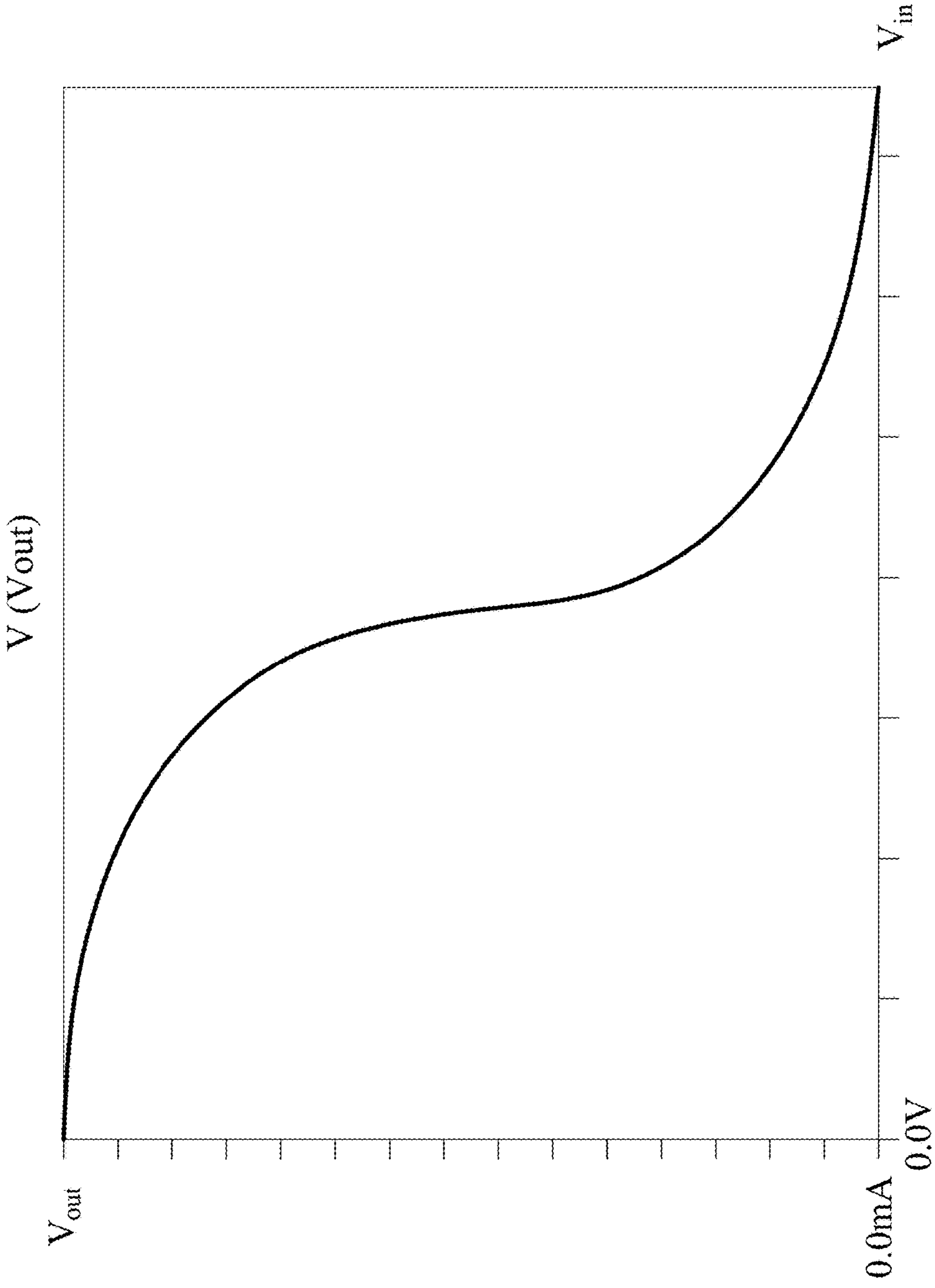
FIG. 19 is a diagram of Vin versus Vout of the integrated circuit device of FIG. 18.
Figure 20:
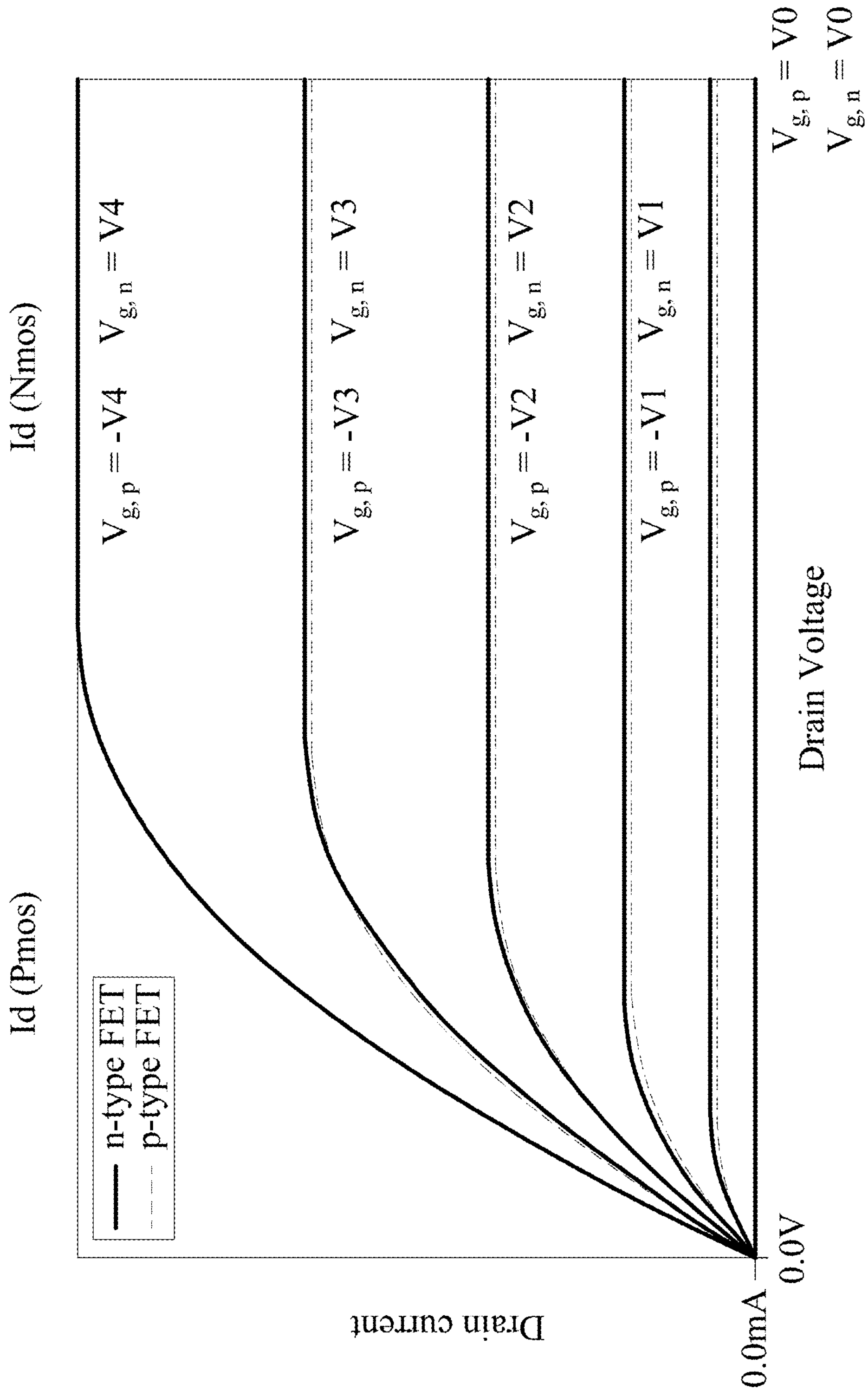
FIG. 20 is a diagram of a drain voltage versus a drain current of the integrated circuit device of FIG. 18.

FIG. 19 is a diagram of Vin versus Vout of the integrated circuit device of FIG. 18. The n-type transistor NT and the p-type transistor PT are electrically connected to form a CMOS inverter. FIG. 20 is a diagram of a drain voltage versus a drain current of the integrated circuit device of FIG. 18 under various gate voltages ($V_{g,n}$) for the n-type transistor NT and gate voltages ($V_{g,p}$) for the p-type transistor PT. The voltages V0-V4 are zero or positive, and the voltages V0-V4 increases in a sequence. To let the saturated current of the p-type transistor PT and the n-type transistor NT matches (e.g., overlapping) each other, the Id-Vd curves of the two transistors NT and PT are simulated with various widths. By the configuration, when a negative gate bias voltage and a positive gate bias voltage having the same absolute values are applied to the transistors PT and NT, the curves of drain voltage versus a drain current of the transistors PT and NT match and overlap with each other.

In some embodiments, by computer simulation, it is designed that the channel layer width (e.g., the Janus TMD layer) of the p-type transistor PT needs to be different from the width of the channel layer (e.g., the Janus TMD layer) of the n-type transistor PT since most materials existed mobility difference between electron and hole. If the widths are not adjusted according to the mobility difference, the curves of drain voltage versus the drain current of the transistors PT and NT may not match and overlap with each other.

FIGS. 21A-21G illustrate a method for manufacturing an integrated circuit device according to some embodiments of the present disclosure. It is understood that additional steps may be implemented before, during, or after the steps shown FIGS. 21A-21G, and some of the steps described may be replaced or eliminated for other embodiments of the method 100.

Figure 21B:
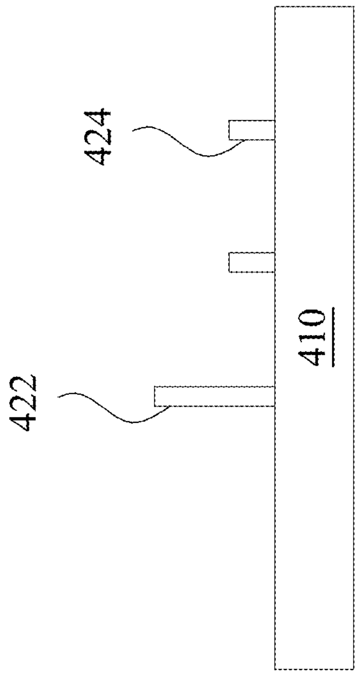
FIGS. 21A-21G illustrate a method for manufacturing an integrated circuit device according to some embodiments of the present disclosure.
Figure 21A:
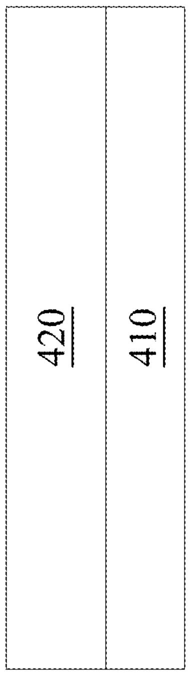

Reference is made to FIG. 21A. A filler material layer 420 is formed over a substrate 410. The filler material layer 420 may include $SiO_2$, $HfO_2$, poly (methyl methacrylate) (PMMA), the like, or combination thereof. The filler material layer 420 may be patterned into filler elements 422 and 424 by suitable lithography and etching process as shown in FIG. 21B. Reference is made to FIG. 21C. A conductive material is deposited over the structure of FIG. 21B. For example, the conductive material can be metal or graphene. A planarization process (e.g., CMP process) is performed to remove excess portions of the conductive material. Remaining portions of the conductive material form electrodes 432 and 436 and contacts 434. In some embodiments, the formation and patterning of the filler material layer (see FIGS. 21A and 21B), and the deposition and planarization of the conductive materials may be repeated, so as to form the desired profile of the electrodes 432 and 436 and contacts 434 as shown in FIG. 21C.

Figure 21D:
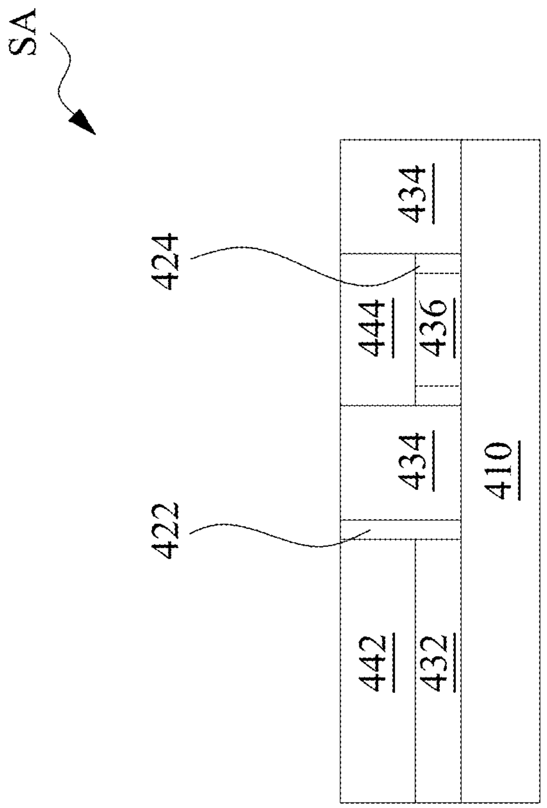
Figure 21C:
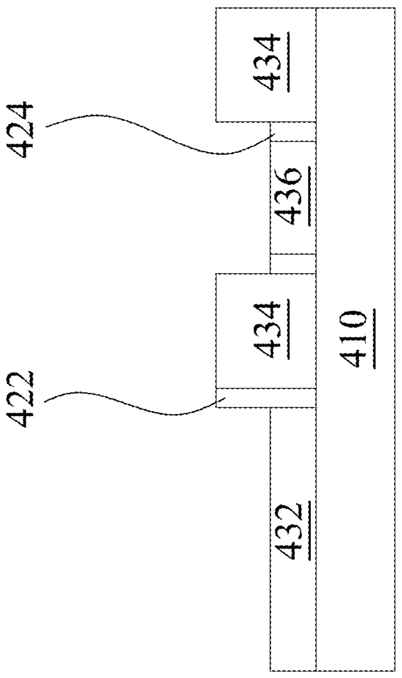

Reference is made to FIG. 21D. An oxide layer is deposited over the structure of FIG. 21C. A planarization process is performed to remove excess portions of the oxide layer. Remaining portions of the oxide layer form the dielectric layers 442 and 444. A structure SA including a substrate 410, filler elements 422 and 424, electrodes 432 and 436, contacts 434, dielectric layers 442, 444 is formed. The filler elements 424 spaces and isolate the electrode 436 from the contacts 434. The filler element 422 spaces and isolate the electrode 432 from the contact 434.

Figure 21E:
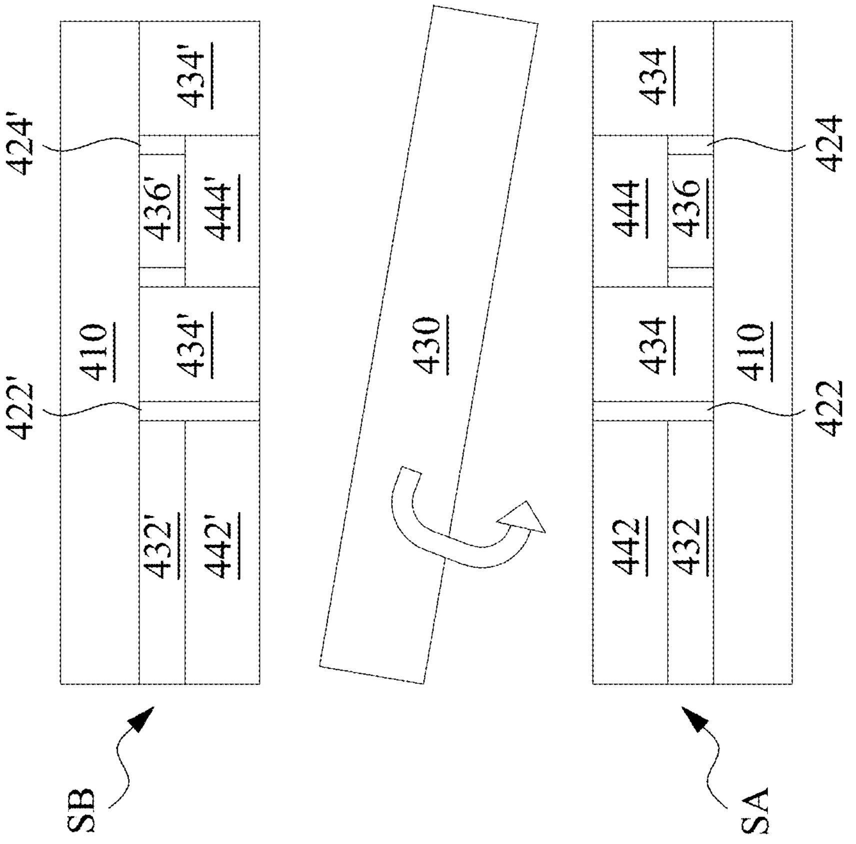
Figure 21F:
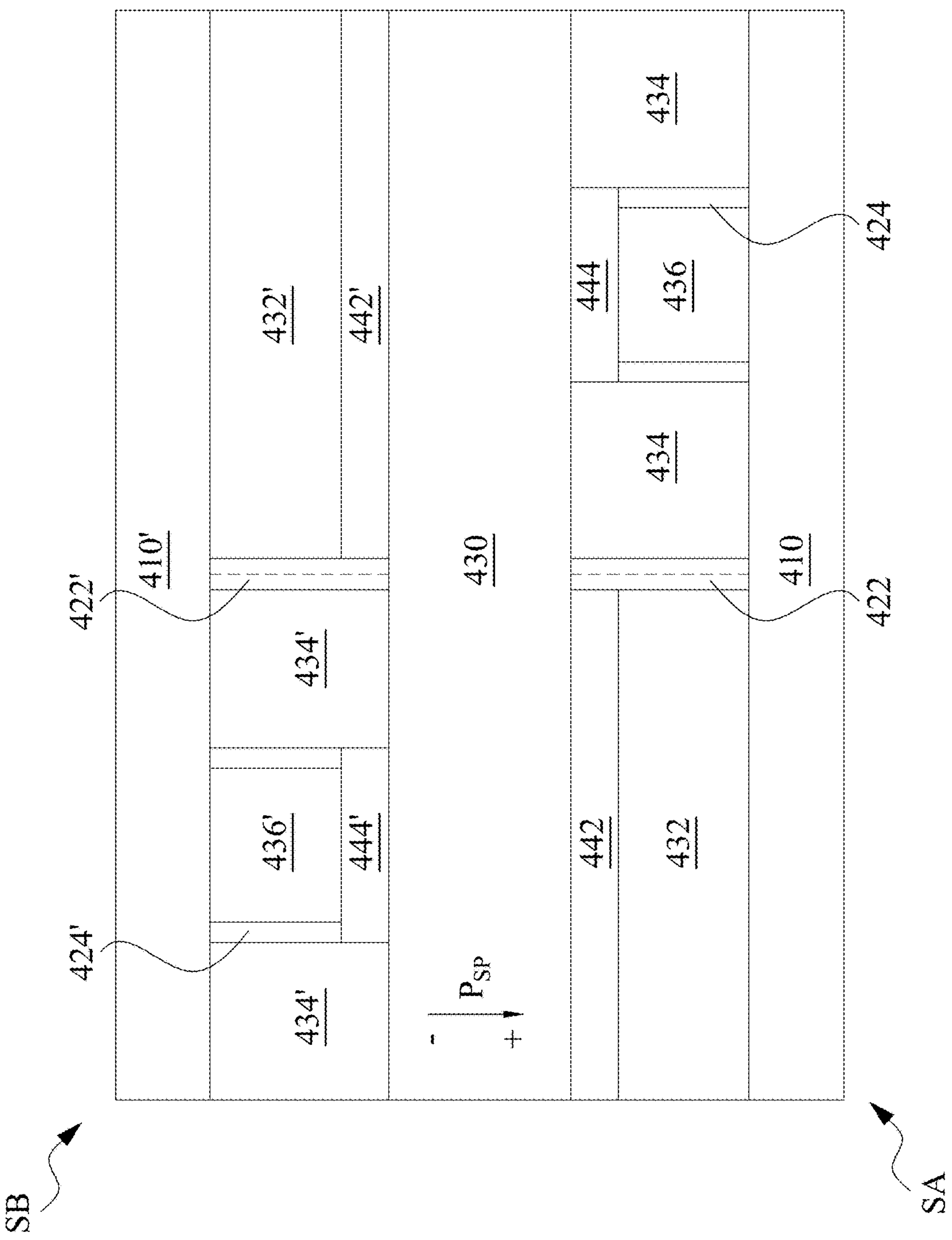
Figure 21G:
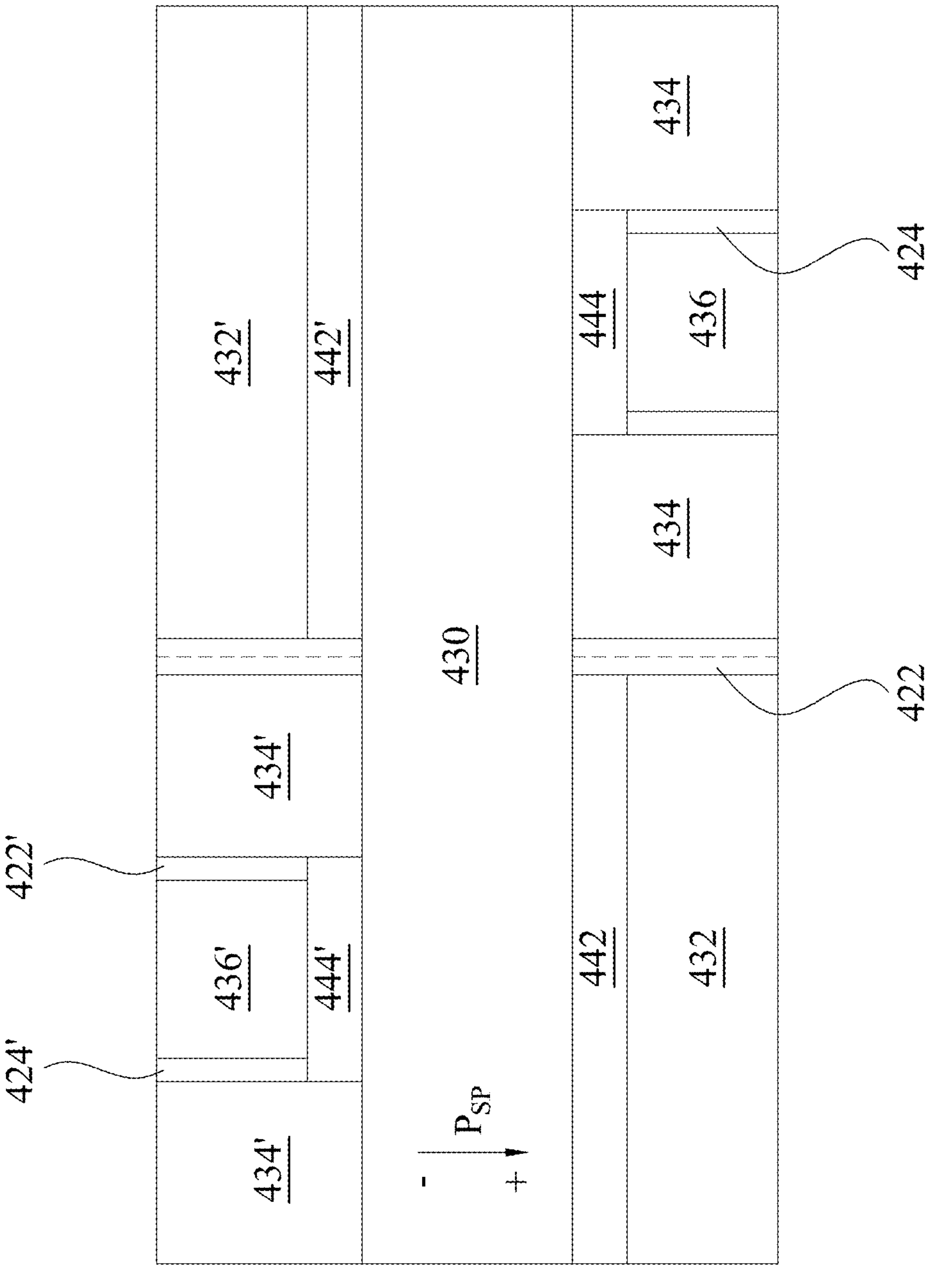

Reference is made to FIG. 21E. A structure SB including a substrate 410', filler elements 422' and 424', electrodes 432' and 436', contacts 434, dielectric layers 442', 444', is fabricated by steps similar to that of FIGS. 21A-21D. And, a Janus TMD layer 430 is put, deposited, or transferred to the position between the structures SA and SB of FIG. 21D. As aforementioned, the examples of the Janus TMD layer 430 include MoSSe, WSSe. MoSTe. PtSeTe, the like, or a combination thereof. The resulted structure is shown in FIG. 21G. In some embodiments, the substrate 410 of the structure SA and the substrate 410' of the structure SB, may then be optionally removed by suitable methods, and the resulted structure is shown in FIG. 21G.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a structure of transistors based on 2D JTMD material is fabricated. Utilizing the asymmetry electron affinity property of JTMD, both n-contact and p-type contacts can be formed when different faces attach contact material. Thus, n-type and p-type FET can be produced on a single JTMD material without doping, causing the formation of 2DEG and 2DHG. This device solves the doping problem in TMD materials and gives the potential to build n-type transistor and p-type transistor on one material.

According to some embodiments of the present disclosure, an integrated circuit device includes a Janus transition metal dichalcogenide layer having opposite first and second sides; a first gate structure on the first side of the Janus transition metal dichalcogenide layer; and a second gate structure on the second side of the Janus transition metal dichalcogenide layer.

According to some embodiments of the present disclosure, an integrated circuit device includes a Janus transition metal dichalcogenide layer; a n-type transistor, comprising a first gate structure and a first contact in contact with a first side of the Janus transition metal dichalcogenide layer; a p-type transistor, comprising a second gate structure and a second contact in contact with a second side of the Janus transition metal dichalcogenide layer, wherein the first and second contacts comprise a same conductive material.

According to some embodiments of the present disclosure, a method for fabricating an integrated circuit device includes forming two first contacts over a first substrate; forming two second contacts over a second substrate; placing a Janus transition metal dichalcogenide layer between the first and second substrates, such that the first contacts are in contact with a first side of the Janus transition metal dichalcogenide layer, and the second contacts are in contact with a second side of the Janus transition metal dichalcogenide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:

a first substrate and a second substrate;

a Janus transition metal dichalcogenide layer having opposite first and second sides, wherein the Janus transition metal dichalcogenide layer is disposed between the first substrate and the second substrate;

a first gate structure disposed on the first substrate and on the first side of the Janus transition metal dichalcogenide layer;

a second gate structure disposed on the second substrate and on the second side of the Janus transition metal dichalcogenide layer;

two first contacts disposed on the first substrate and in contact with the first side of the Janus transition metal dichalcogenide layer; and two second contacts disposed on the second substrate and in contact with the second side of the Janus transition metal dichalcogenide layer.

2. The integrated circuit device of claim 1, wherein the first contacts are at opposite sides of a first channel portion of the Janus transition metal dichalcogenide layer overlapping the first gate structure; and the second contacts are at opposite sides of a second channel portion of the Janus transition metal dichalcogenide layer overlapping the second gate structure.

3. The integrated circuit device of claim 2, wherein the first and second contacts comprise a same conductive material.

4. The integrated circuit device of claim 1, wherein the first gate structure comprises a high-k dielectric layer.

5. The integrated circuit device of claim 1, further comprising:

a third gate structure disposed on the second substrate and on the second side of the Janus transition metal dichalcogenide layer, wherein the third gate structure vertically overlaps the first gate structure.

6. The integrated circuit device of claim 1, further comprising:

a fourth gate structure disposed on the first substrate and on the first side of the Janus transition metal dichalcogenide layer, wherein the fourth gate structure vertically overlaps the second gate structure.

7. The integrated circuit device of claim 1, wherein the Janus transition metal dichalcogenide layer has a first chalcogen atom adjacent the first side and a second chalcogen atom adjacent the second side, and the second chalcogen atom is different from the first chalcogen atom.

8. The integrated circuit device of claim 1, wherein the Janus transition metal dichalcogenide layer is a MoSSe layer.

9. A method for fabricating an integrated circuit device, comprising:

forming two first contacts over a first substrate;

forming two second contacts over a second substrate; and placing a Janus transition metal dichalcogenide layer between the first and second substrates, such that the first contacts are in contact with a first side of the Janus transition metal dichalcogenide layer, and the second contacts are in contact with a second side of the Janus transition metal dichalcogenide layer.

10. The method of claim 9, further comprising:

forming a first gate structure over the second substrate, wherein placing the Janus transition metal dichalcogenide layer between the first and second substrates is performed such that the first gate structure overlapping a channel region of the Janus transition metal dichalcogenide layer between the first contacts.

11. The method of claim 10, further comprising:

forming a second gate structure over the first substrate, wherein placing the Janus transition metal dichalcogenide layer between the first and second substrates is performed such that the second gate structure overlaps a channel region of the Janus transition metal dichalcogenide layer between the second contacts.

12. The method of claim 10, wherein the Janus transition metal dichalcogenide layer is a MoSSe layer.

13. The method of claim 10, wherein the first and second contacts comprise a same conductive material.

14. The method of claim 13, wherein the conductive material is graphene.

15. A method for fabricating an integrated circuit device, comprising:

forming a first gate structure over a first substrate;

forming a second gate structure over a second substrate; and placing a Janus transition metal dichalcogenide layer between the first and second substrates, such that the first gate structure is in contact with a first side of the Janus transition metal dichalcogenide layer and the second gate structure is in contact with a second side of the Janus transition metal dichalcogenide layer.

16. The method of claim 15, further comprising:

removing the first and second substrate.

17. The method of claim 15, further comprising:

forming two first contacts over the first substrate; and forming two second contacts over the second substrate, wherein placing the Janus transition metal dichalcogenide layer between the first and second substrates such that the two first contacts in contact with the first side of the Janus transition metal dichalcogenide layer and the two second contacts in contact with the second side of the Janus transition metal dichalcogenide layer.

18. The method of claim 17, wherein the two first contacts and the two second contacts comprise graphene.

19. The method of claim 15, wherein the Janus transition metal dichalcogenide layer is a MoSSe layer.

20. The method of claim 15, wherein the Janus transition metal dichalcogenide layer has a first chalcogen atom adjacent the first side and a second chalcogen atom adjacent the second side, and the second chalcogen atom is different from the first chalcogen atom.

* * * * *